United States Patent
Hsu et al.

(10) Patent No.: US 8,198,174 B2
(45) Date of Patent: Jun. 12, 2012

(54) AIR CHANNEL INTERCONNECTS FOR 3-D INTEGRATION

(75) Inventors: Louis L. Hsu, Fishkill, NY (US); Brian L. Ji, Chappaqua, NY (US); Fei Liu, Yorktown Heights, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/536,176

(22) Filed: Aug. 5, 2009

(65) Prior Publication Data

US 2011/0031633 A1    Feb. 10, 2011

(51) Int. Cl.
*H01L 21/44*    (2006.01)
(52) U.S. Cl. . 438/459; 438/619; 438/672; 257/E21.585; 257/E23.161
(58) Field of Classification Search ............ 438/455, 438/459, 619, 672; 257/E21.585, E23.161
See application file for complete search history.

(56) References Cited

U.S. PATENT DOCUMENTS

| | | | |
|---|---|---|---|
| 4,841,355 A | 6/1989 | Parks | |
| 5,309,318 A | 5/1994 | Beilstein, Jr. et al. | |
| 5,355,942 A | 10/1994 | Conte | |
| 6,521,516 B2 | 2/2003 | Monzon et al. | |
| 6,717,812 B1 | 4/2004 | Pinjala et al. | |
| 7,157,787 B2 | 1/2007 | Kim et al. | |
| 7,203,064 B2 | 4/2007 | Mongia et al. | |
| 7,215,547 B2 | 5/2007 | Chang et al. | |
| 7,294,926 B2 | 11/2007 | Schubert et al. | |
| 7,326,629 B2 | 2/2008 | Nagarajan et al. | |
| 7,354,798 B2 | 4/2008 | Pogge et al. | |
| 8,034,693 B2 * | 10/2011 | Shibata et al. | 438/422 |
| 8,035,223 B2 * | 10/2011 | Garrou et al. | 257/713 |
| 2005/0254215 A1 | 11/2005 | Khbeis et al. | |
| 2007/0025079 A1 | 2/2007 | Salmon | |
| 2008/0156462 A1 | 7/2008 | Arik et al. | |

OTHER PUBLICATIONS

Author (Disclosed Anonymously), "Single Layer and Dual In-Die Fractal Micro Channel for Micro Chip Cooling", IP.com Electronic Publication, Jan. 31, 2006, IP.com No. IPCOM000133584D.
N. Nakamura et al., "Cost-effective air-gap interconnects by all-in-one post-removing process", 2008 IEEE, pp. 193-195.

* cited by examiner

*Primary Examiner* — Wensing Kuo
(74) *Attorney, Agent, or Firm* — F. Chau & Associates, LLC; Louis J. Percello

(57) ABSTRACT

A three-dimensional (3D) chip stack structure and method of fabricating the structure thereof are provided. The 3D chip stack structure includes a plurality of vertically stacked chips which are interconnected and bonded together, wherein each of the vertically stacked chips include one or more IC device strata. The 3D chip stack structure further includes an air channel interconnect network embedded within the chip stack structure, and wherein the air channel interconnect network is formed in between at least two wafers bonded to each other of the vertically stacked wafers and in between at least two bonded wafers of the vertically stacked wafers at a bonding interface thereof. In addition, the 3D chip stack structure further includes one or more openings in a peripheral region of the chip stack structure that lead into and out of the air channel interconnect network, so that air can flow into and out of the air channel interconnect network through the one or more openings to remove heat from the chip stack structure.

17 Claims, 22 Drawing Sheets

(i) Chip-Level Fabrication Technology

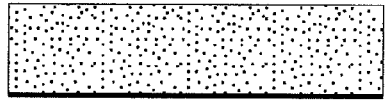

(1) Chip after FEOL and BEOL processing

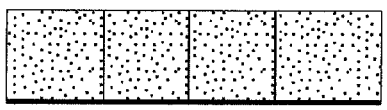

(2) Electrical through via fabrication

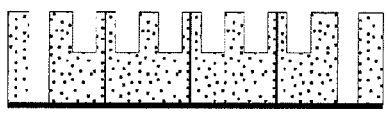

(3) Silicon etch for microchannels and fluidic TSVs
(two lithography steps)

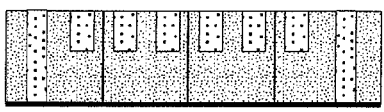

(4) Spin coat and polish a sacrificial polymer material

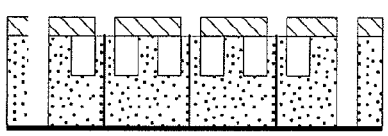

(5) Avatrel cover for microfluidic channels spin coated,
patterned and cured (one lithography step),
sacrificial polymer decomposed

FIG. 14E
Prior Art

AIR CHANNEL INTERCONNECTS FOR 3-D INTEGRATION

BACKGROUND (i) Technical Field

This invention relates to the manufacture of three-dimensional, vertical chip integration, and more particularly to methods for fabricating air channel interconnects for cooling.

(ii) Description of Related Art

The trend in semiconductor integration is moving from two-dimensional (2-D) to three-dimensional (3-D) design. For example, to provide increased cache memory for microprocessors, a number of proposals are exploring methods for building three-dimensional (3-D) integrated circuits. A typical 3-D fabrication process includes building devices on wafers that are then thinned, providing vertical interconnections through the wafers, stacking the wafers so that vertical connections are established between wafers at different levels and bonding the wafers with a suitable material.

As discussed below, there have been attempts to address certain difficulties associated with fabricating 3D integrated circuits including: (1) the need for reliable wafer bonding, (2) stringent wafer cleanliness and flatness requirements, (3) the need for reliable, low-resistance inter-wafer vertical connections, and (4) stringent wafer-to-wafer lateral registration requirements. However, thus far, there does not appear to be any effective and feasible way to resolve the need for efficient heat removal through the 3-D device. Conceptually, for example, when two 100 W/cm$^2$ microprocessor chips are stacked on top of each other, a net power density of 200 W/cm$^2$ is produced which is beyond the heat removal limits of available air cooling technology.

Methods for addressing the above-mentioned difficulties such as bonding, material requirements and alignment in forming 3D integrated circuit (IC) structures have been widely documented and are discussed below in connection with FIGS. 14A-14D of the present application.

For example, U.S. Pat. No. 7,157,787, entitled, "Process of vertically stacking multiple wafers supporting different active integrated circuit (IC) devices" describes a first method (See FIG. 14A), the disclosure of which is hereby incorporated by reference herein in its entirety. The above method includes selectively depositing a plurality of metallic lines 106 on opposing surfaces of adjacent wafers 710, 720, 730, 740 in inter layer dielectric (ILD) layers 714, 724, 734, 744, bonding the adjacent wafers, via the metallic lines 106, to establish electrical connections between active devices formed active layers 712, 722, 732, 742 on vertically stacked wafers 710, 720, 730, 740; and forming one or more vias 750 to establish electrical connections between the active devices formed on the active layers 712, 722, 732, 742 located on the vertically stacked wafers 710, 720, 730, 740 and an external interconnect. Metal bonding areas on opposing surfaces of the adjacent wafers can be increased by using one or more dummy vias, tapered vias, or incorporating an existing copper (Cu) dual damascene process.

Another conventional 3D IC fabrication example, U.S. Pat. No. 7,354,798, entitled "Three-dimensional device fabrication method", proposes a method for fabricating a three-dimensional integrated device including a plurality of vertically stacked and interconnected wafers (See FIG. 14B), the disclosure of which is hereby incorporated by reference herein in its entirety. Wafers 1, 2, 3 are bonded together using bonding layers of thermoplastic material 16, 26, 36 such as polyimide, electrical connections are realized by vias 22 in the wafers connected to studs 37. A conducting body provided in the wafer beneath the device region and extending laterally, may connect the via 22 with the opening 23 filled with metal 38 and bonding to metal layer 24 in the back surface. Accordingly, the conducting path through the wafer may be led underneath the devices thereof.

A third conventional example described in U.S. Pat. No. 7,326,629, entitled, "Method of stacking thin substrates by transfer bonding" describes another method of stacking, bonding, and electrically interconnecting a plurality of thin integrated circuit wafers to form an interconnected stack of integrated circuit layers (See FIGS. 14C-14D) the disclosure of which is hereby incorporated by reference herein in its entirety. FIG. 14C shows a dicing lane trench that was formed through the thinned wafer layer 310 terminating at or slightly within the masterslice level 322 of the base wafer 320. The second thinned wafer layer 360 is then bonded to the top of the stack 8 with the bonding adhesive 368. The stack 8 is then processed to the point wherein the bond pads 394a, 394b, and 394c are completed. Then, thinner wafer layer 360 is penetrated by anisotropic etching to extend the dicing lane trench to form extended trench 331, as illustrated in FIG. 14D. Further, as shown in FIG. 14D, the extended trench 331 is then lined with a protective sidewall 334. The sidewall 334 forms a hermetic seal which protects the edge regions of the bonding adhesive 368, and 328, from contamination after the dice are cut apart in the dicing operation.

The above process in U.S. Pat. No. 7,326,629 can be used to further stack and interconnect any number of thinned wafer layers to form a three dimensional integrated circuits. This approach provides a low temperature wafer bonding method using an adhesive thereby enabling standard wafers to be integrated into a 3D stack with existing wire bonded wafers.

One more conventional example teaches 3D IC structure with micro-channel for cooling is published in the Journal of Electrical and Electronics Engineers (IEEE), entitled "Cost-effective air-gap interconnects by all-in one post removing process", by N. Nakamura, et al., published 2008, pages 193-195, ID Publication No. 987-1-4244-1911-1/08, the disclosure of which is hereby incorporated by reference herein in its entirety. The above conventional method is illustrated in FIG. 14E of the present application and has certain difficulties associated therewith as discussed below. As shown in FIG. 14E, the fabrication of electrical through silicon via (or TSVs) on a wafer step (2) takes place after FEOL and BEOL processing step (1). Following this, a Bosch process is utilized for etching fluidic TSVs and micro-channels as shown in step (3) illustrated in FIG. 14E. Next, a sacrificial polymer material (for example, Unity) is spin-coated on the micro-channels and polished in step (4) illustrated in FIG. 14E. A polymer (Avatrel) is next spun-on, patterned and cured to form a cover for the micro-channels and fluidic TSVs in step (5). Unity is then decomposed by heating to 260° C.

However the following drawbacks may be associated with the above method such as: a complicated and inefficient structure wherein the fluid is fed either from top or bottom of the structure and through each of the layers, and therefore the vertical channel is just a hole similar to TSV for the fluid to feed through. Also, the structure has just a few holes penetrating through all the chip layers forming a bottle neck for heat removal at such vertical vias. Also, the friction caused by the fluid flow through a channel increases the pressure required to maintain the fluid velocity by the square of the channel diameter, thereby necessitating an enormous and impractical amount of pressure to be delivered by a pumping system for channel diameters at these dimensions. In addition, fluid cooling media may be susceptible to corrosion and contamination which may not make this process practical for the real-life chips. Moreover, the above process may be an expensive process, wherein the micro-channels are formed after FEOL and BEOL with additional process steps which may mean higher cost.

Other methods for boosting heat dissipation for such 3D stack structures proposed so far are done by using extra dummy metal interconnects. In general, wiring density has already reached its maximum capacity. Some designs must sacrifice the electro-migration rule in order to allow for high wiring density. Other designs must continuously increase the number of wiring levels to accommodate the wiring demand. However, providing extra dummy wirings on the chip for the purpose of improving thermal dissipation may not be a desirable solution.

Additionally, methods utilizing air dielectric are gaining more attention in the conventional art for providing better isolation. Without proper isolation noise coupling from power supplies as well as adjacent signal lines, the signal integrity can be significantly degraded, particularly at GHz transmission rate. Air dielectric is a common term for a dielectric, insulating material that itself is composed of air. In other words, void regions are placed inside the chip and serve as dielectric for conductors. However, there may be difficulties associated with the forming of air dielectric material including: (1) weak structure with a lack of physical support; (2) room for trapping residues and (3) fabrication difficulties. Also, if these air dielectric regions are not connected to form a structure that reaches the chip exterior, then they will act as thermal insulators which cannot effectively dissipate heat generated within the chip.

Nevertheless, despite the above-mentioned attempts to address the above-mentioned difficulties associated with 3D integrated circuits, there is still appears to be no effective and feasible way in the conventional art thus far which solves the need for efficient heat removal through the 3-D device.

Accordingly, there is a need in the art for improving the efficiency of heat dissipation through a 3D integrated circuit structure as well as signal integrity.

BRIEF SUMMARY

In accordance with an exemplary embodiment of the present invention, a three-dimensional (3D) chip stack structure is provided. The 3D chip stack structure includes a plurality of vertically stacked chips which are interconnected and bonded together, wherein each of the vertically stacked chips includes one or more IC device strata. The 3D chip stack structure further includes an air channel interconnect network embedded within the chip stack structure. The air channel interconnect network is formed in between at least two chips bonded together of the vertically stacked chips at a bonding interface thereof. In addition, the 3D chip stack structure further includes one or more openings located on a peripheral region of the chip stack structure which leads into and out of the air channel interconnect network, so that air can flow into and out of the air interconnect network through one or more opening to remove heat from the chip stack structure.

In accordance with another exemplary embodiment of the present invention, a method of forming interconnected air channels within semiconductor wafers is provided. The method includes processing an upper wafer to form one or more semiconductor devices and circuitry for connecting the one or more semiconductor devices in a device layer located on a front surface of the upper wafer, forming a plurality of air vias in a portion of the upper wafer and forming a plurality of through-silicon vias (TSVs) in another portion of the upper wafer, filling each of the air vias with a material comprising one of a conductive material or a dummy material and filling each of the TSVs with a conductive material, forming a protective structure on the air vias and a bonding pad on the TSVs, forming a stud for wafer bonding on the bonding pad located on the TSVs, and removing at least a portion of the protective structure and the conductive material from inside the air vias, thereby forming a plurality of vertical air channels and an opening exposing the plurality of vertical air channels.

The method further includes processing a lower wafer to form one or more semiconductor devices and circuitry for connecting the one or more semiconductor devices in a device layer located on a front surface of the lower wafer, forming a bonding pad on the device layer located on a front surface of the lower wafer, depositing an insulating layer on the lower wafer, including on the bonding pad, forming an opening in the insulating layer exposing the bonding pad, aligning and bonding the upper wafer and the lower wafer to each other, thereby forming an embedded air channel interconnect network which includes the vertical air channels and a horizontal air channel which are interconnected to each other at an interface between the bonded upper wafer and lower wafer, thinning a backside of the upper wafer to expose the vertical air channels and the TSVs and forming a passivation layer on the exposed surface of the backside of the upper wafer.

In accordance with another exemplary embodiment of the present invention, a semiconductor structure is provided. The semiconductor structure includes a plurality of layers bonded together, each of the layers having semiconductor devices and interconnection lines and vias. The lines and the vias of at least one of the layers are electrically interconnected to the lines and the vias of at least another of the layers. The semiconductor structure further includes an air channel interconnect network embedded within the semiconductor structure, wherein the air channel interconnect network is located within at least two of the layers of the plurality of layers bonded together and also in between at least two wafers of the plurality of layers bonded together at a bonding interface thereof and an opening located in a peripheral area of the semiconductor structure in which a gas may flow into and out of the air channel interconnect network through this opening to cool the semiconductor structure.

In accordance with another exemplary embodiment of the present invention, a method for fabricating a three-dimensional integrated (IC) chip stack structure having interconnected horizontal and vertical air channels embedded therein is provided. The method includes processing a plurality of wafers to have one or more IC active device strata formed therein, forming a plurality of vertical air channels in at least one of the plurality of wafers, forming an air channel opening in an upper region of at least another of the plurality of wafers, and bonding and electrically interconnecting the plurality of wafers together such that there is an electrical connection between the IC active devices, wherein at least one wafer having the vertical air channels formed therein is bonded to at least another wafer having the channel opening formed in an upper surface thereof such that the vertical air channels formed within at least one wafer are interconnected to the channel opening of at least another wafer at a bonding interface between at least one wafer and at least one other wafer. The method further includes thinning the backside of at least one of the wafers, depositing a passivation layer on a surface of at least one wafer and dicing the plurality of bonded wafers to form the 3D IC chip stack structure having the interconnected horizontal and vertical air channels embedded therein.

BRIEF DESCRIPTION OF THE SEVERAL VIEWS OF THE DRAWINGS

Exemplary embodiments of the present invention can be understood in more detail from the following description taken in conjunction with the attached drawings in which:

FIGS. 14A-14E illustrate four prior art examples regarding to 3D IC structure.

DETAILED DESCRIPTION

A three-dimensional wafer process integration in accordance with exemplary embodiments of the present invention includes an upper wafer process sequence, a lower wafer process sequence and wafer to wafer bonding sequence to form an air channel interconnect network within the upper wafer and the lower wafer and also in between the upper wafer and the lower wafer at a bonding interface thereof as illustrated in FIGS. 1-12 and described in detail below.

Figure 1:
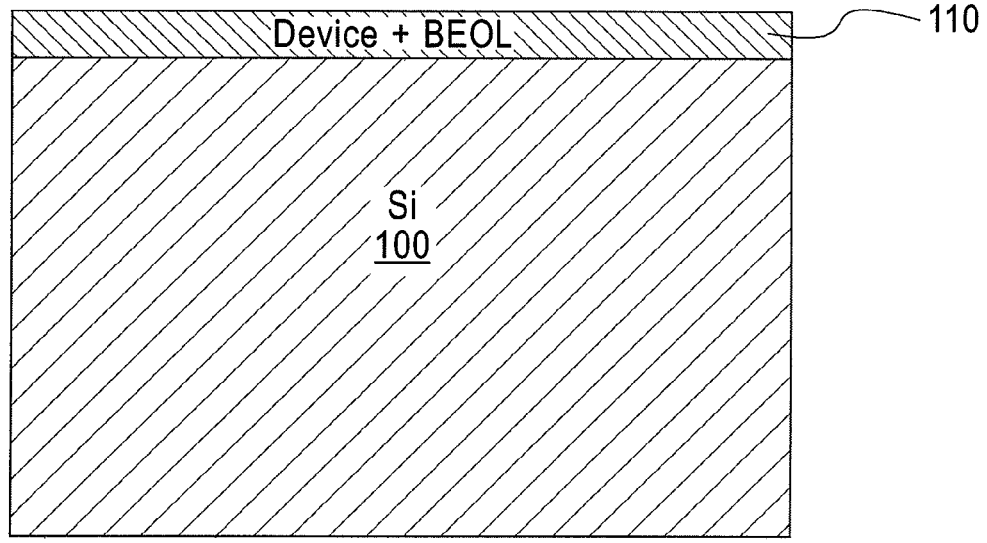
FIGS. 1 to 12 are schematic illustrations of steps in a fabrication process to form a two wafer bonded structure with an air channel interconnect network in accordance with a first exemplary embodiment of the invention.

(1) Upper Wafer Processing Sequence:

Referring to FIG. 1 an upper wafer 100, e.g., a silicon wafer, is processed through conventional front of line (FEOL) and back of line (BEOL) processes to have complementary metal oxide semiconductor (CMOS) devices (e.g. transistors, resistors and capacitors) and circuitry for connecting the CMOS devices provided in a device layer 110 which is formed of a dielectric material located on the front surface of the upper wafer 100.

Figure 2:
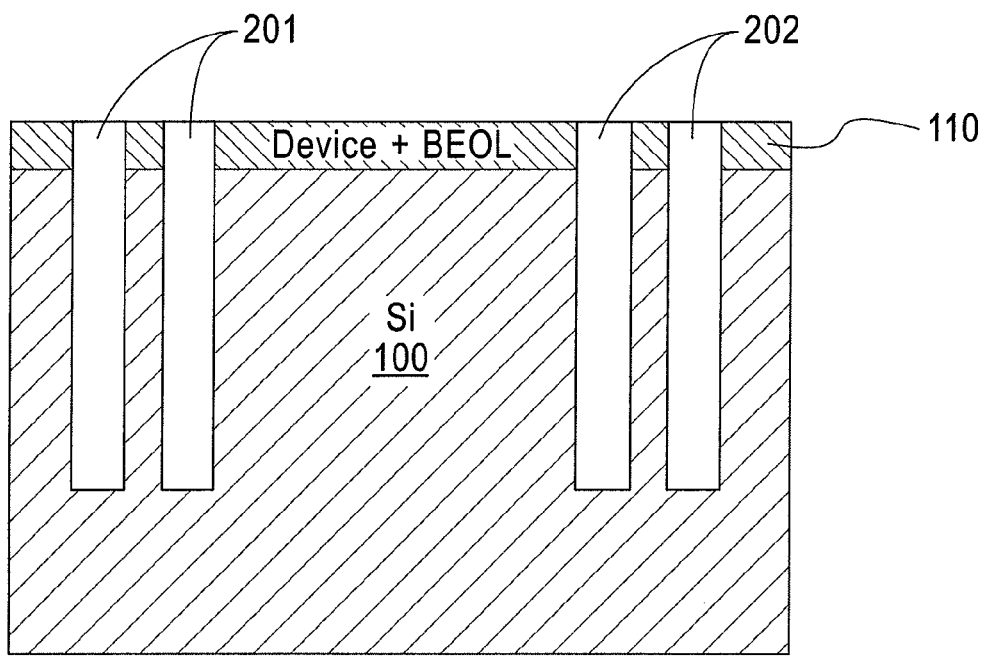

Referring to FIG. 2, conventional lithography processing is carried out to pattern through silicon vias followed by a deep reactive ion etching (RIE) process or Bosch process to form high aspect ratio contact holes. In this process, either a photo resist mask material (e.g, a soft mask) or a hard mask (e.g. chemical vapor deposition oxide or nitride) may be used in the lithography process to form the high aspect ratio contact holes. For example, in the present exemplary embodiment, a conventional damascene process (e.g. single damascene or dual damascene process) is carried out wherein a photoresist is coated on the silicon wafer 100 and then the photoresist is patterned using a mask to form openings in the photoresist.

Next, an RIE process is performed using the openings in the photoresist to etch both (i) the dielectric material of the device layer 110 and (ii) the upper silicon wafer 100 underneath the device layer 110 to thereby form holes 201 and 202. A portion of the holes is used for air vias 201 for thermal dissipation and another portion of the holes is used as through silicon vias (TSVs) 202 for multiple chips interconnects. The forming of the air vias 201 may be formed simultaneously with the TSVs 202 or in separate steps. The plasma gases used for etching the device layer 110 and the upper silicon wafer 100 may include any suitable plasma gases known in the art for these RIE etching purposes.

The diameter for the contact holes 201 and 202 are in the range of, for example, 1 µm to 10 µm, but are not limited to these dimensions. In addition, it is preferred that the diameters for each of 201 and 202 are the same as one another but this is not required.

Figure 3:
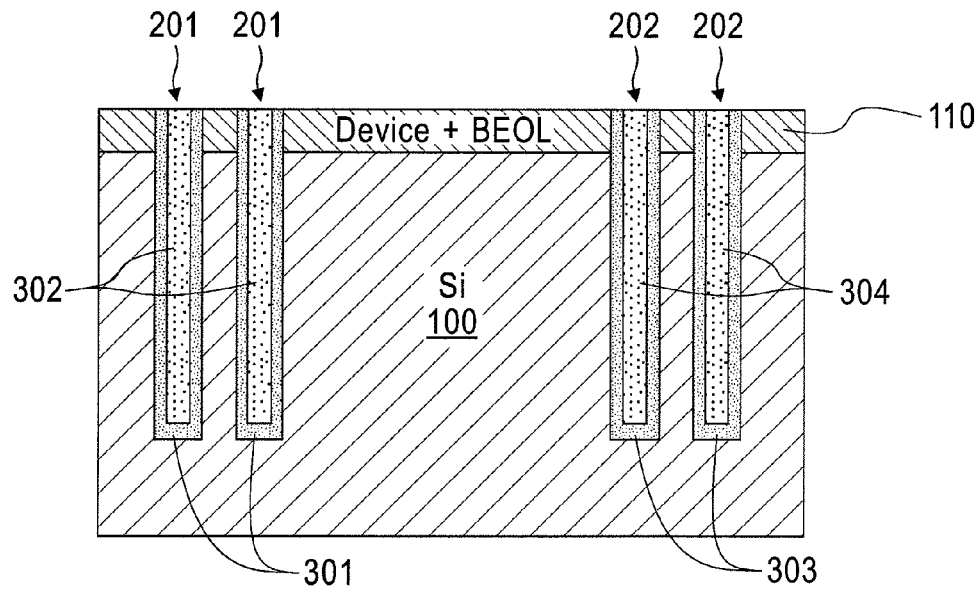

Referring to FIG. 3, in the next step of the above mentioned conventional damascene process, sidewall liners 301, 303 are then formed on the sidewalls of the vias 201 and 202, respectively. These sidewall liners may be formed conformally on the sides of the vias 201 and 202 by conventional processes such as for example, chemical vapor deposition (CVD) and plasma chemical vapor deposition (PCVD). In addition, the materials used for the sidewall liners 301 and 303 may be those which are conventionally known in the art, including for example, oxide or nitrides. The vias 201 and 202 are then filled with copper 302, 304, respectively by copper plating. Next, a chemical mechanical polish (or CMP) is performed to remove excessive copper material located above the vias 201 and 202 such that copper is located only in the vias 201 and 202 to thereby prevent any short circuiting from occurring.

Figure 4:
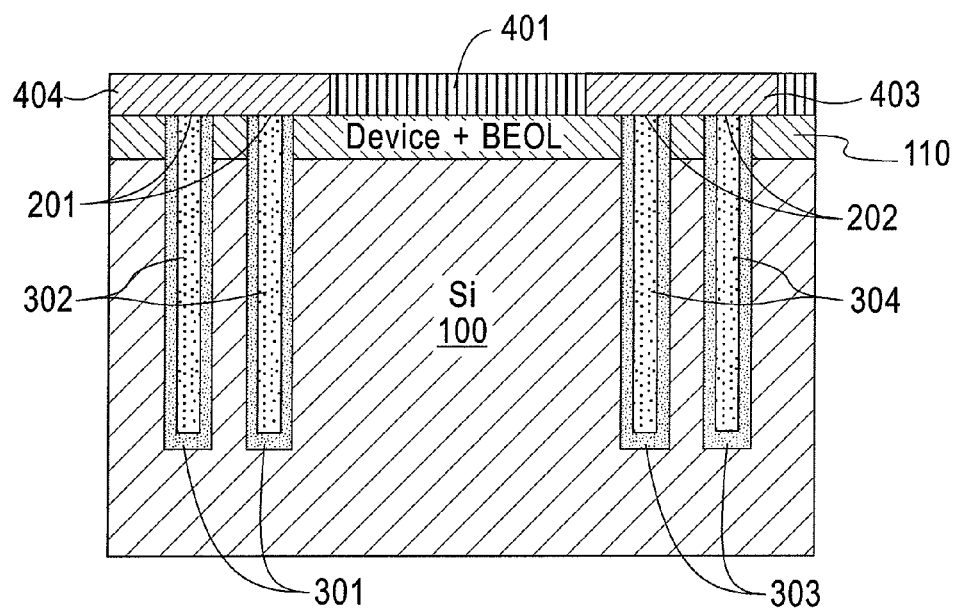

Referring to FIG. 4, a passivation layer 401 is deposited on the upper silicon wafer 100, including on the device layer 110, the air vias 201 and TSVs 202. The passivation layer 401 may be formed of materials which include but are not limited to, for example, dielectric materials such as silicon dioxide or low-k dielectric materials known in the art such as, doped oxides, organic materials, highly fluorinated materials and porous materials. The passivation layer 401 may be deposited on the upper wafer 100 by the appropriate methods known in the art such as for example, by CVD or spin on methods. If necessary, in the present exemplary embodiment, a conventional lithography process followed by a conventional RIE process as part of a conventional damascene process are used to form openings in the insulating layer 401 to form at least one copper (Cu) pad 403 on the TSVs 202 for grouping TSVs 202 and at least one sacrificial or dummy copper pad 404 on the air vias 201 as explained in further detail below. The dummy copper pads 404 may be used to serve as protective cap to cover the air vias 201.

In forming at least one copper (Cu) pad 403 and at least one dummy copper pad 404, a photoresist is coated on the silicon wafer 100 including the insulating layer 401 and then the photoresist is patterned using a conventional lithography process to form openings in the photoresist. Next, a conventional RIE process is performed using the openings in the photoresist to etch (i) a portion of the passivation layer 401 and a portion of the dielectric material of the device layer 110 in a region above and adjacent to the air vias 201 and (ii) also etch a portion of the passivation layer 401 and the device layer 110 in a region above and adjacent to the TSVs 202 to thereby form openings in the passivation layer 401 which expose the air vias 201 and TSVs 202, respectively. The openings in the passivation layer 401 are then filled with copper 403, 404 by copper plating.

Subsequently, a chemical mechanical polish (or CMP) is performed to remove excessive copper material located above the passivation layer 401 to thereby form (i) at least one Cu pad 403 in the opening in the passivation layer 401 on the TSVs 202 and the device layer 110 for grouping TSVs 202 and (ii) also form at least one sacrificial or dummy copper pad 404 in the opening of passivation layer 401 on the air vias 201 and the device layer 110. It is noted that the exemplary embodiments of the present invention are not limited to the above mentioned processes and that any suitable process known in the art for forming the pads 403, 404 may be used.

Figure 5:
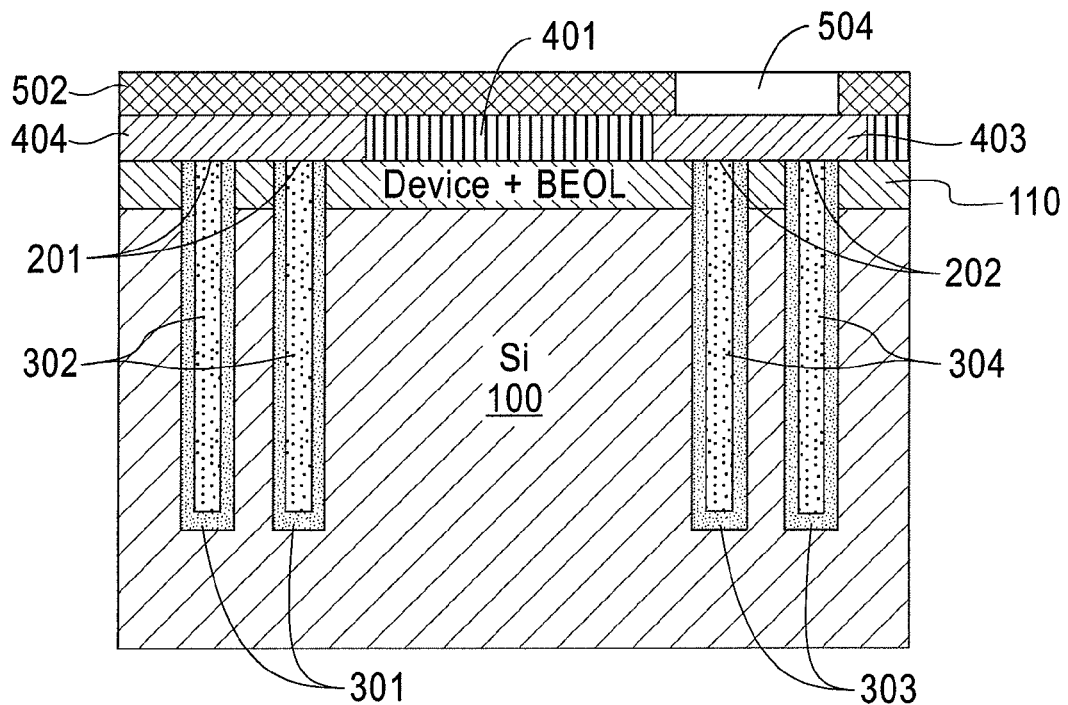

Referring to FIG. 5, an insulating layer 502 is deposited on the silicon wafer, including on top of the passivation layer 401, the dummy copper pad 404 and the copper pad 403. The insulating layer 502 may be formed of materials which include but are not limited to, for example, dielectric materials such as silicon dioxide or low-k dielectric materials known in the art such as, doped oxides, organic materials, highly fluorinated materials and porous materials. The insulating layer 502 may be deposited by the appropriate methods known in the art such as for example, by CVD or spin on methods.

A portion of the insulating layer 502 on the TSVs 202 is opened by conventional lithography and RIE processes as part of a conventional damascene process. Copper is then deposited in the opening formed in the insulating layer 502 in the region containing the TSVs 202 by copper plating. Next, a CMP process is performed to remove excess copper above the insulating layer 502, to thereby form Cu studs 504 filling in the opening formed in the insulating layer 502 on the TSVs 202. These Cu studs 504 may be used for wafer bonding. It is noted that the exemplary embodiments of the present invention are not limited to the above mentioned processes and that any suitable process known in the art for forming bonding pad or stud structures 504 may be used.

Figure 6:
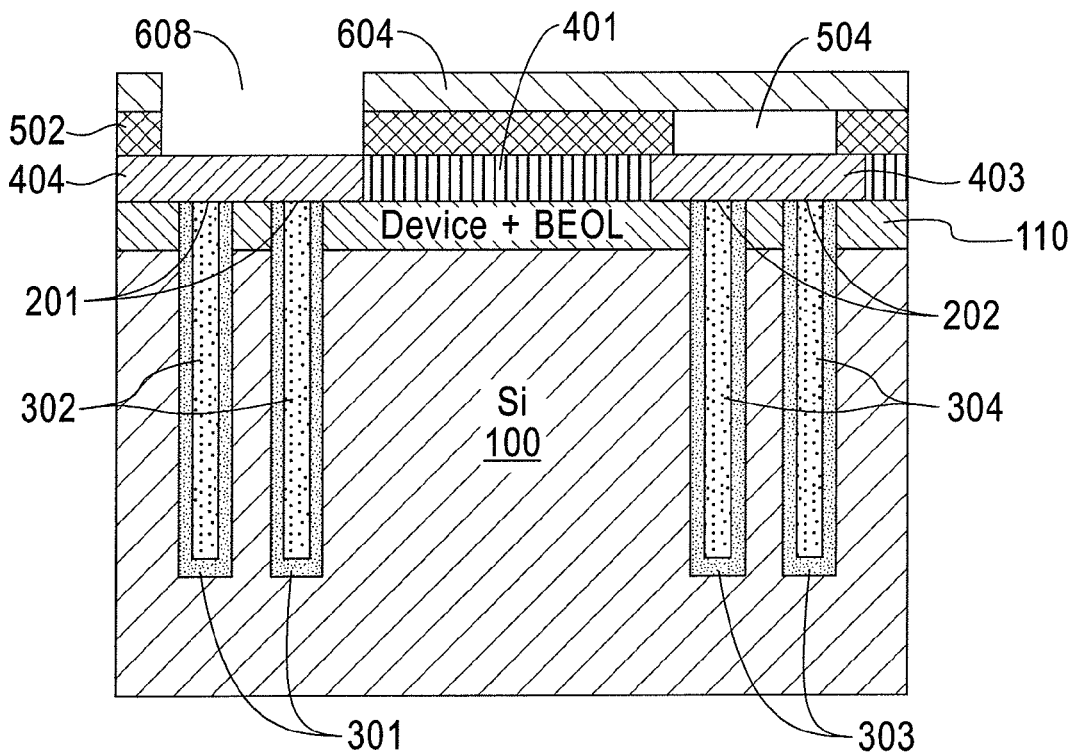

Referring to FIG. 6, a photoresist layer 604 is applied by spin coating on the silicon wafer 100 including the insulating layer 502 and copper stud 504. The photoresist layer 604 is patterned using conventional lithography processes to have an opening formed therein in the region containing the air vias 201. Next, the insulating layer 502 located in the region containing the air vias 201 is then etched by a conventional RIE process using the opening in the photoresist layer 604 to form an opening 608 in the insulating layer 502 which exposes the dummy copper pad 404.

Figure 7:
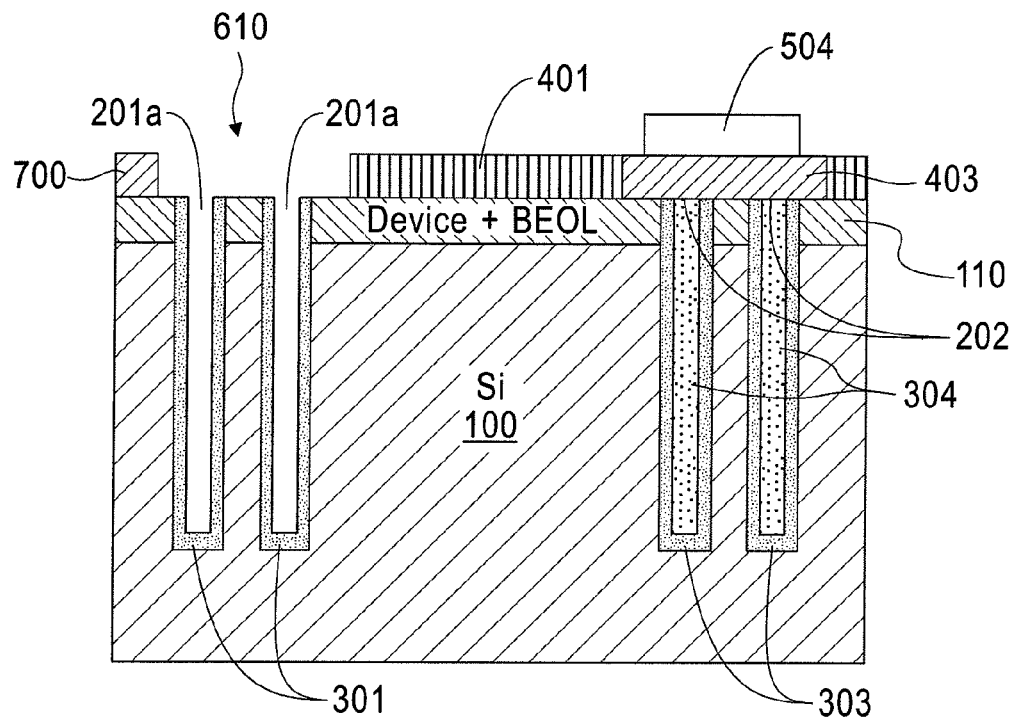

Referring to FIG. 7, the insulating layer 502 is removed and the photoresist 604 is stripped by methods known in the art. Next, a wet etch is performed to selectively remove the dummy copper pad 404 and the dummy copper 302 inside the air vias 201. As shown in FIG. 7, by removing the dummy copper pad 404 and the copper 302 inside air vias, vertical channels 201a are thereby formed and an opening 610 exposing these vertical air channels 201a is formed. In other words, the vertical air channels 201a are formed by removing the copper 302 inside the air vias 201 and the opening 610 exposing the vertical air channels 201a is formed by removing the dummy copper pad 404. It is also noted that when removing the dummy copper pad 404 and the copper 302 inside the air vias 201, a small amount of copper material 700 from dummy copper pad 404 is left on the edge of the upper wafer 100 which becomes a side plug 700a for interconnected air channels when wafer bonding occurs as discussed hereinafter in FIG. 11. The formational of the side plug is optional but is preferred to prevent clogging of the vertical air channels 201a.

Figure 8:
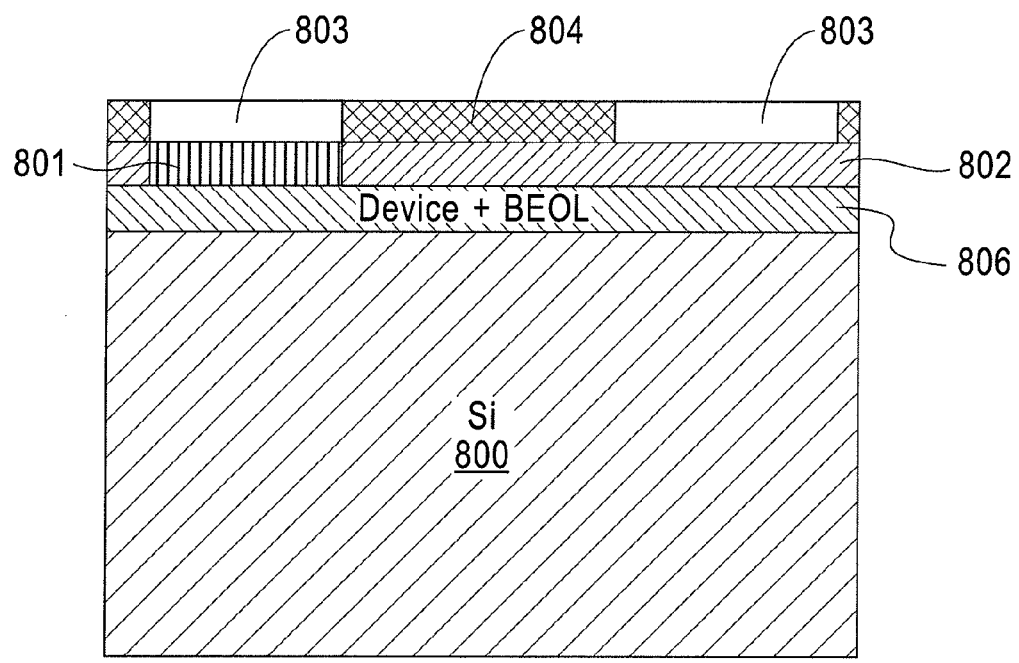

(2) Lower Wafer Processing Sequence:

Referring to FIG. 8, a lower wafer 800, e.g. a silicon wafer, is processed through FEOL and BEOL processes to have devices and circuitry provided in a device layer 806 which is formed of dielectric material located on the front surface of the lower silicon wafer 800. Copper pad 801 is formed inside a first insulating layer 802 by a conventional damascene process similar to that discussed above with regard the upper wafer 100 processing.

For example, in this exemplary embodiment, the first insulating layer 802 may be formed of materials known in the art such as a dielectric material or low-k dielectric materials and may be deposited on the device layer 806 located on the front surface of the silicon wafer 800, by methods known in the art such as, CVD or spin-on methods. Next, a photoresist is then coated on the first insulating layer 802 and then the photoresist is patterned by conventional lithography processes to form openings therein. Subsequently, the first insulating layer 802 is etched by a conventional RIE process using the opening formed in the photoresist to form an opening in the first insulating layer 802 which exposes a portion the device layer 806. Subsequently, copper is then deposited in the opening formed in the first insulating layer 802 by copper plating. Then, a CMP process is performed to remove excess copper above the first insulating layer 802 to thereby form copper pad 801 in the opening of the first insulating layer 802 and on the device layer 110.

A second insulating layer 804 formed of materials known in the art such as a dielectric material or low-k dielectric materials may then be deposited on the silicon wafer 800 including the copper pad 801 and the first insulating layer 802, by methods known in the art such as, for example, CVD or spin-on methods. Next, the second insulating layer 804 is patterned via conventional lithography techniques and then a conventional RIE is performed to etch portions of the second insulating layer 804 to form openings 803 therein. One of the openings 803 formed in the second insulating layer 804 exposes the copper pad 801 and another of the openings 803 exposes a portion of the first insulating layer 802.

Figure 9:
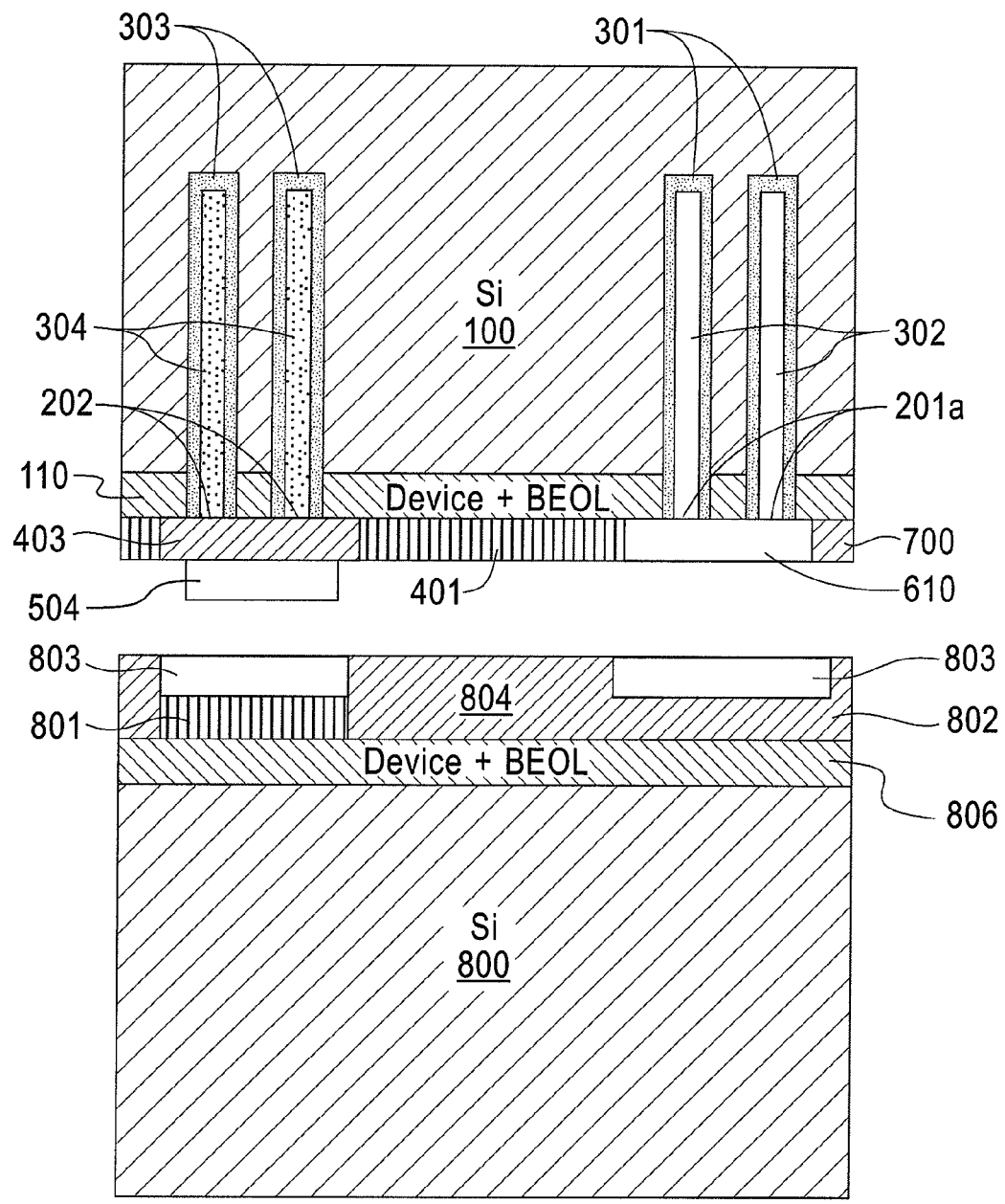

(3) Wafer Bonding:

Referring to FIG. 9, in the present exemplary embodiment, the upper wafer 100 and lower wafer 800 are aligned face to face. The upper wafer 100 and the lower wafer 800 may be aligned face to face using, for example, infrared (IR) alignment. However, exemplary embodiments of the present invention are not limited to the above alignment techniques but rather any other suitable alignment techniques known in the art may be used to align the upper wafer 100 and the lower wafer 800.

Figure 10:
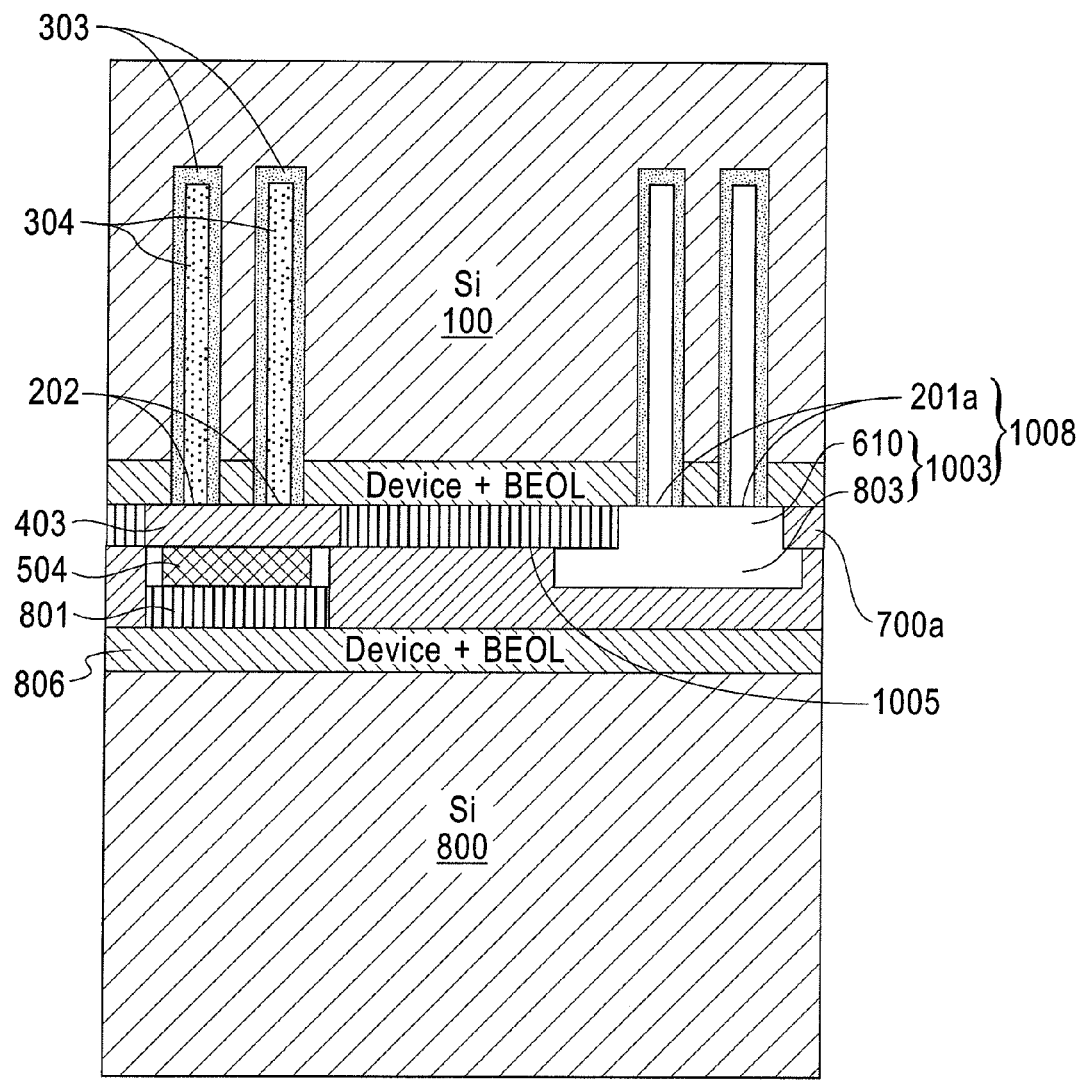

Referring to FIG. 10, the upper wafer 100 and the lower wafer 800 are then bonded together. The upper wafer 100 and the lower wafer 800 are bonded together via, for example, Cu—Cu thermo-compression bonding to form electrical connections. However, the bonding of the upper wafer 100 and the lower wafer 800 to each other is not limited to the above process but rather the upper wafer 100 and the lower wafer 800 may be bonded by any suitable bonding means known in the art.

Further, as illustrated in FIG. 10, a horizontal air channel 1003 and vertical air channels 201a are formed interconnected with each other within the upper wafer 100 and the lower wafer 800 and also in between the upper wafer and the lower wafer at a bonding interface 1005 between the upper wafer 100 and the lower wafer 800 when the upper wafer 100 and the lower wafer 800 are bonded to each other. The horizontal air channel 1003 is formed from opening 610 in the upper wafer combining with opening 803 in the lower wafer at the bonding interface 1005 between the upper wafer 100 and lower wafer 800 when these wafers 100, 800 are bonded to each other. Accordingly, in the present exemplary embodiment, the openings 610, 803 for forming the horizontal air channel 1003 were formed prior to wafer bonding.

The vertical air channels 201a and horizontal air channels 1003 interconnected to each other together collectively form an air channel interconnect network/air channel interconnects 1008 embedded within each wafer 100, 800 as well at the bonding interface 1005 between two adjacently bonded wafers 100, 800. In other words, the air channel interconnect network 1008 is composed of the vertical air channels 201a and horizontal air channel 1003 interconnected to each other.

In addition, as shown in FIG. 10, a side plug 700a is formed in between the upper wafer 100 and lower wafer 800. It is also noted that side plug 700a is formed as a result of the copper material 700 (see FIG. 7) located on the upper wafer 100 attaching to the top surface of the lower wafer 800 when the upper wafer 100 and lower wafer 800 are bonded to each other, as depicted in FIG. 10. The side plug 700a may prevent the clogging of the horizontal air channel 1003 and vertical air channels 201a prior to wafer dicing and chip formation.

In the present exemplary embodiment, the vertical air channels 201a and the horizontal air channel 1003 each have a diameter, for example, of 1 μm to 10 μm. It is further noted that the vertical air channels 201a and the horizontal air channel 1003 may each also have a diameter of under 1 μm to 0.1 μm in accordance with this embodiment. However, the diameters for the above vertical air channels 201a and the horizontal air channels 1003 are not limited to the above-mentioned diameters but rather may include diameters above and below the above-mentioned diameters. It is preferred however that the diameters for the vertical air channels 201a and the horizontal air channels 1003 are each less than 10 μm.

Figure 11:
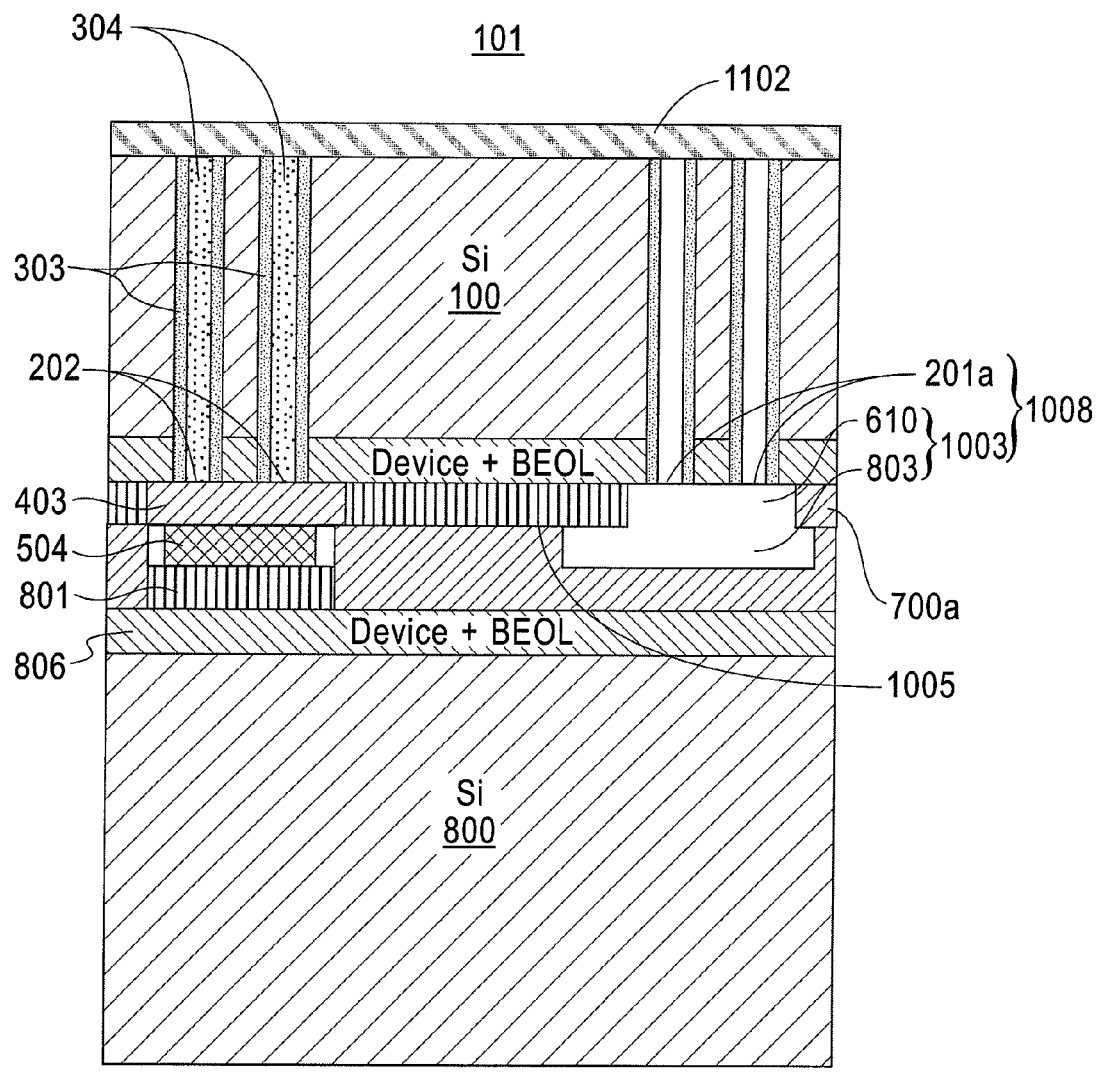

Now referring to FIG. 11, after the upper wafer 100 and the lower wafer 800 are bonded to each other, the backside 101 of the upper wafer 100 is thinned down. The backside 101 of the upper wafer 100 may be thinned down using at least one, for example, grinding, CMP (e.g. high density CMP) and/or etching (e.g. RIE or wet etching) to expose the TSVs 202 and vertical air channels 201a. In the present exemplary embodiment, a recessing wet etch 1102 is used to thin the backside 101 of the upper wafer 100 to expose TSVs 202 and air vias 201.

Figure 12:
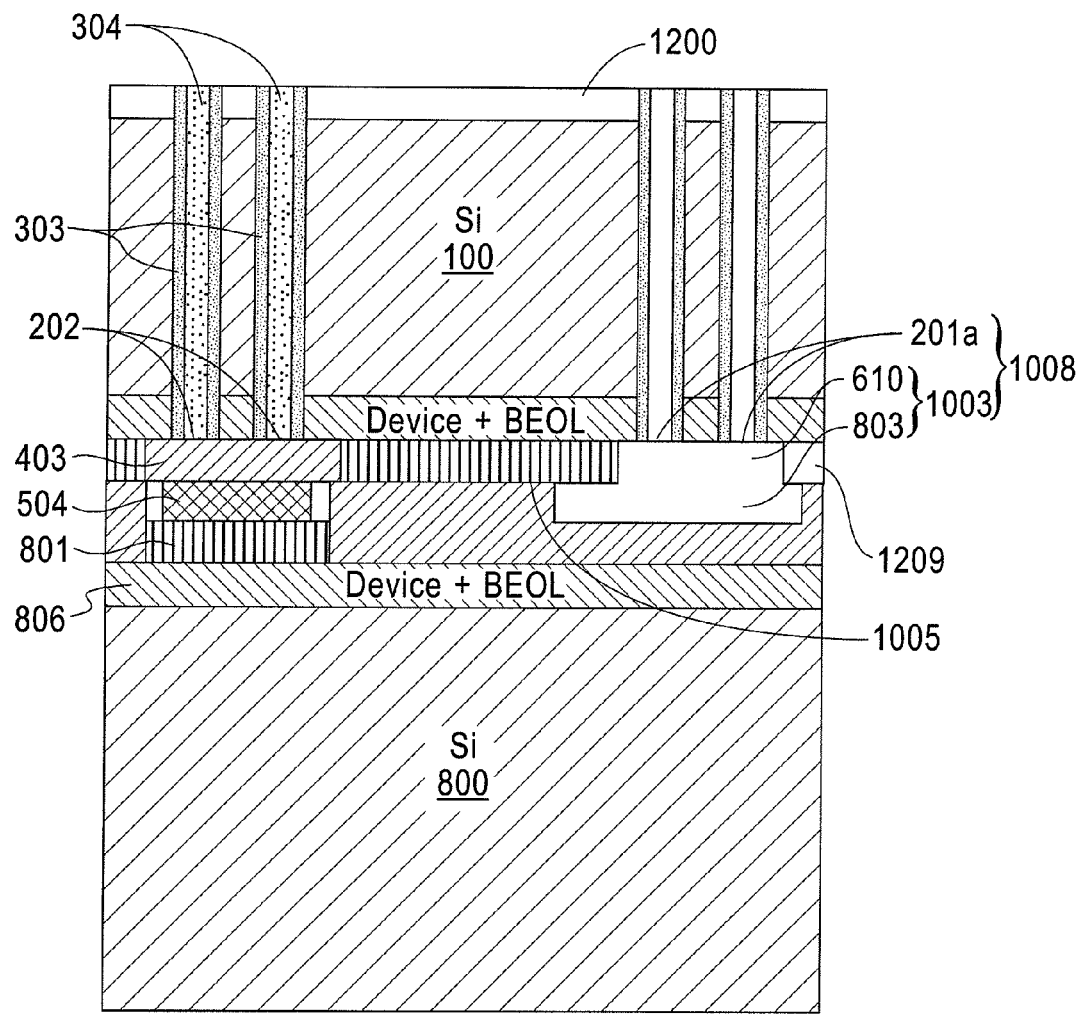

Referring to FIG. 12, an insulating layer 1200 is deposited on the backside of the upper wafer 100 to act as a passivation layer and planarization can be carried out by a CMP process. For example, the insulating layer 1200 may be formed by depositing an oxide material (e.g. TEOS) by a CVD method to act as a passivation layer. Alternatively, in some embodiments, the insulating layer 1200 can be formed by selectively growing a low temperature oxide from the exposed silicon wafer. A planarization step is then performed using a CMP process to remove excess insulating layer 1200 material. Next, the bonded wafers 100, 800 are diced into smaller chips using die singulating techniques known in the art. The side plug 700a is removed when the wafers 100, 800 are diced into chips. FIG. 12 illustrates an empty space or opening 1209 which was previously occupied by the side plug 700a of FIG. 11 which was removed by wafer dicing.

It is noted that in alternative embodiments of the present invention, dicing may occur prior to the upper wafer 100 and the lower wafer 800 being bonded to each other, instead of after the upper wafer 100 and lower wafer 800 have been bonded to each other. For example, in alternative embodiments, the vertical air channels 201a and horizontal air channel 1003 may be formed in upper wafer 100 and lower wafer 800 in the same manner as discussed in the first embodiment, except that in the alternative embodiments, the dicing of the upper wafer 100 and lower wafer 800 may occur prior to bonding the upper wafer 100 and the lower wafer 800 together. For example, in alternative embodiments, the vertical air channels 201a may be formed in upper wafer 100 along with opening 610 exposing vertical air channels 201a and then this upper wafer 100 may be diced into smaller chips. In addition, openings 803 may be formed in the upper surface of the lower wafer 800 and then the lower wafer 800 may be diced into smaller chips. The chips may then be bonded together thereby having an interconnected horizontal air channel 1003 and vertical air channels 201a formed within and between these bonded chips.

Figure 13:
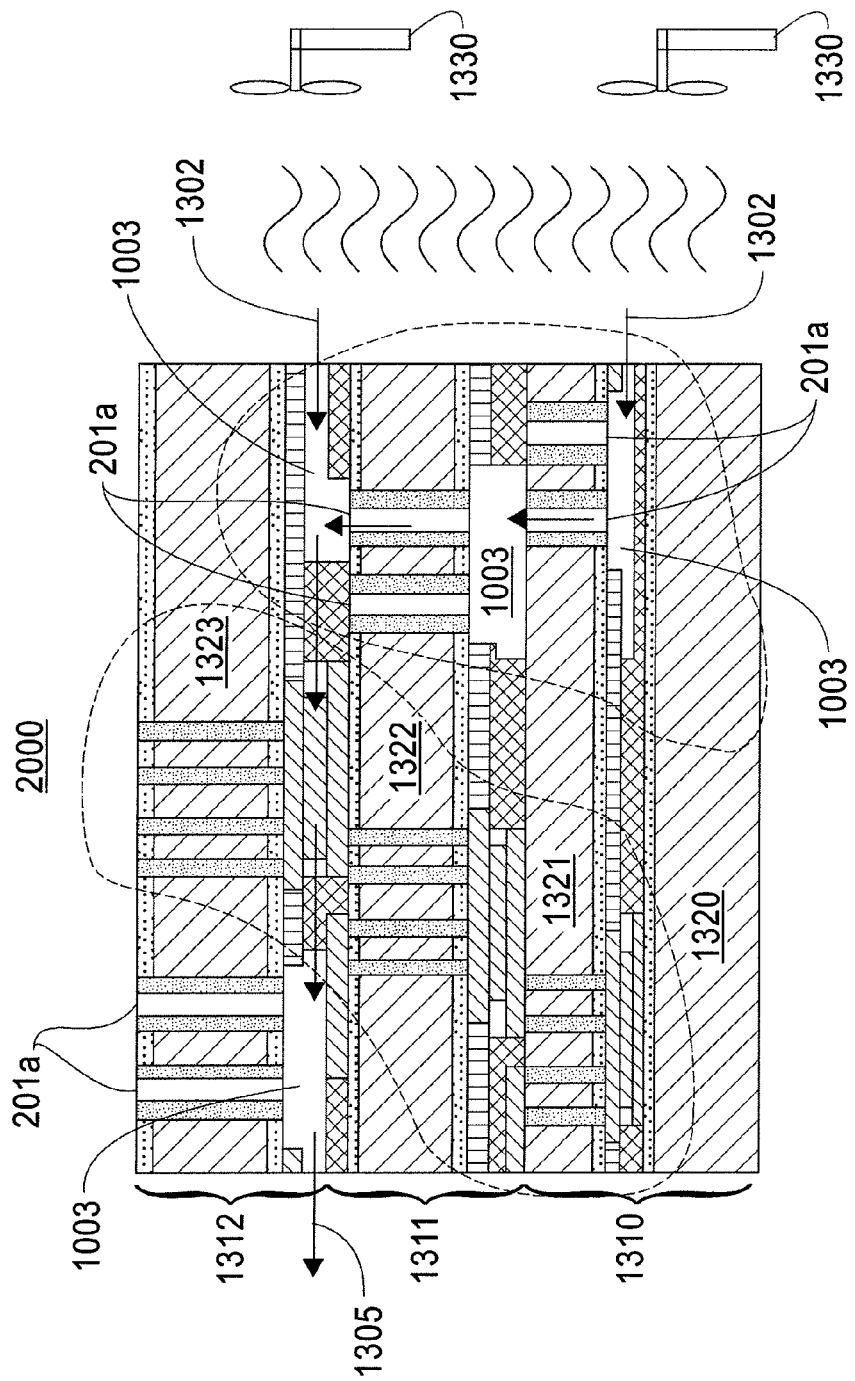
FIG. 13 is schematic illustrations of a 3D integrated (IC) structure having an air channel interconnect network in accordance with a second exemplary embodiment of the invention.
Figure 14A:
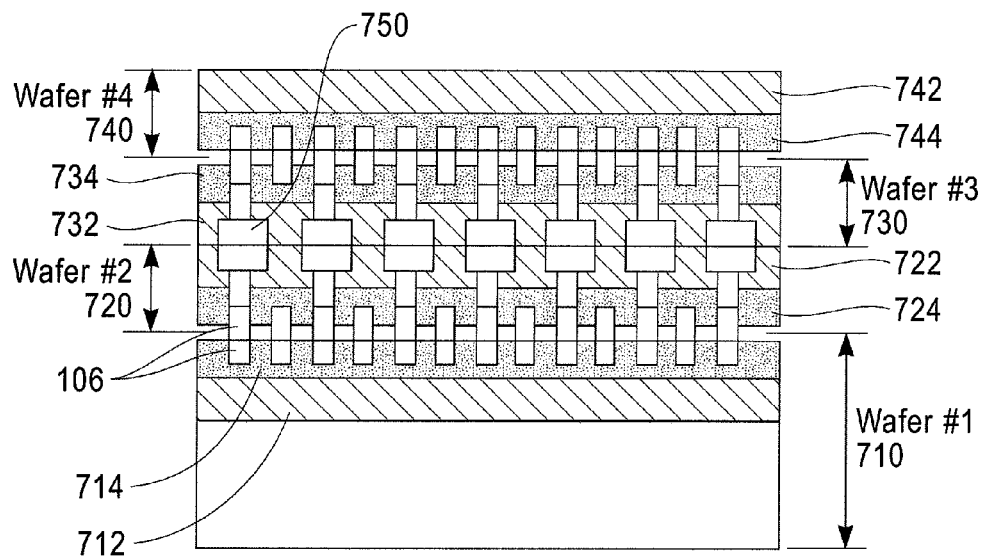
Figure 14B:
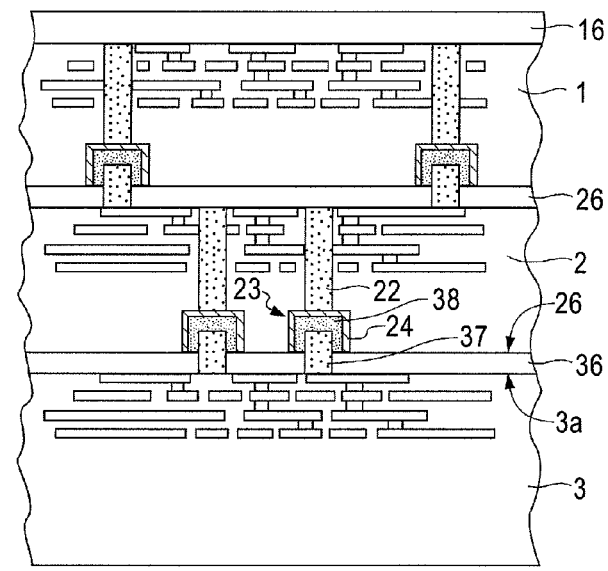
Figure 14C:
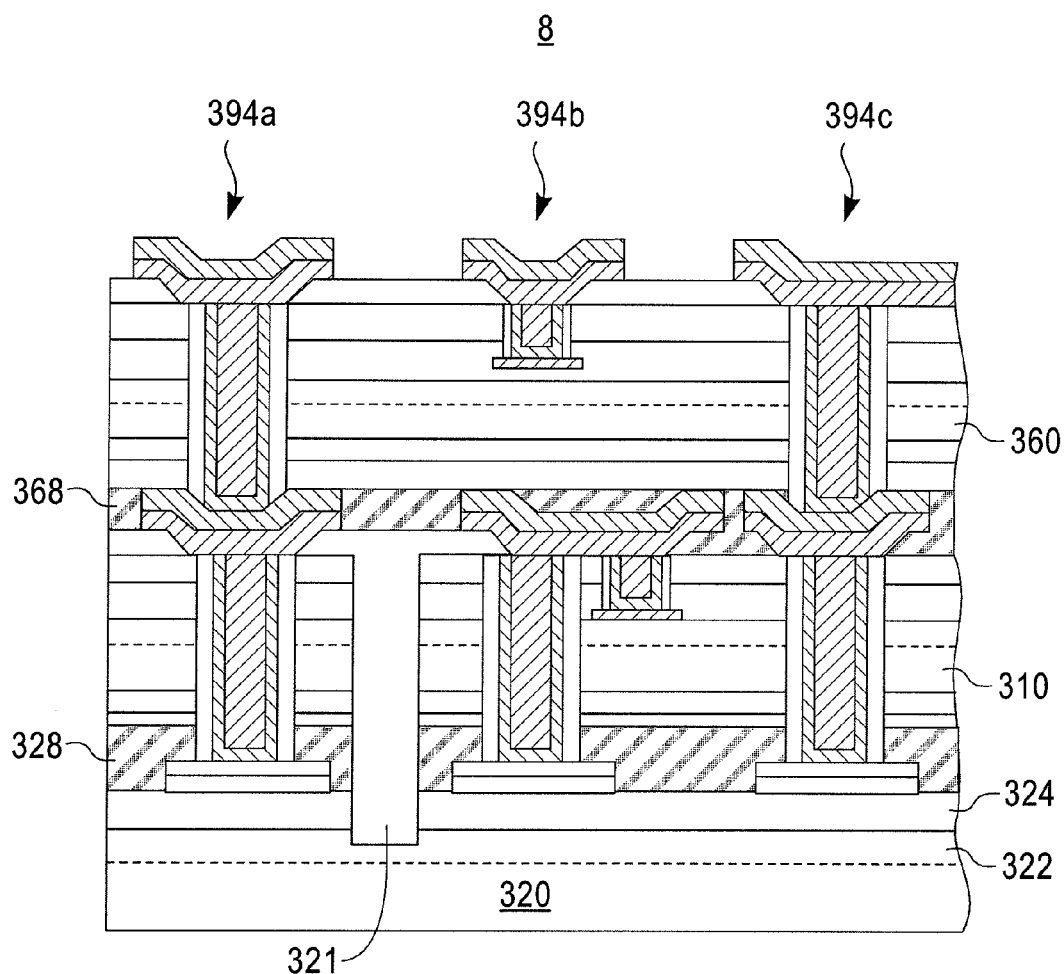
Figure 14D:
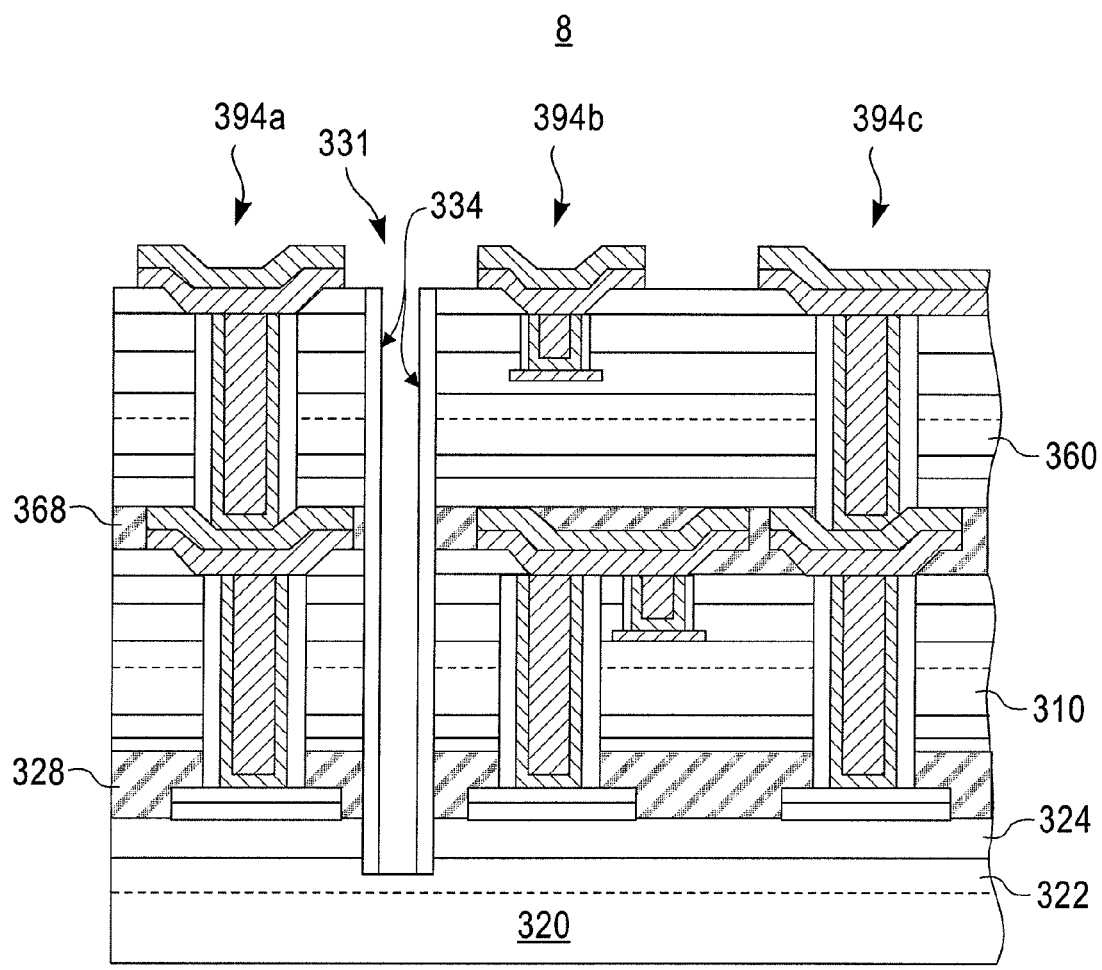

FIG. 13 illustrates a three dimensional integrated circuit (IC) chip stack structure 2000 of a second embodiment of the present invention which includes the interconnected horizontal air channel 1003 and vertical air channels 201a of the first embodiment formed within and in between the stacked wafers of chip stack structure 2000. In the present exemplary embodiment of FIG. 13, three pairs of bonded wafers 1310, 1311, 1312 are stacked. The three pairs of stacked wafers 1310, 1311, 1312 are formed by bonding four wafers 1320, 1321, 1322, 1323 together. The processes for forming the horizontal air channels 1003 and the vertical air channels 201a within and between bonded wafer pairs 1310, 1311 and 1312 illustrated in FIG. 13, may be the same as discussed for the first exemplary embodiment of the present invention.

Further, as shown in FIG. 13, in the present exemplary embodiment, the chip stack includes air inlets 1302 and air outlets 1305 formed on a peripheral region of the chip stack structure 2000. The inlets 1302 and outlets 1305 may be formed by, for example, removing the side plug 700a illustrated in the first embodiment depicted in FIG. 11 during the dicing of the wafers. In this embodiment, the side plug 700a was formed with copper material 700 and thus it is removed using a wet etching process. The air inlets 1302 and outlets 1305 preferably each have a diameter which is the same as the diameter of the horizontal air channel 1003 such as, for example, a diameter preferably in the range of 1 μm to 10 μm.

The air inlets 1302 and outlets 1305 are connected to the horizontal air channel 1003 formed at the interfaces between the wafer pairs 1310, 1311, 1312 of the chip stack structure. For example, these inlets 1302 allow the passage of a gas, e.g., air from an air source used to generate air circulation such as for example, fans 1330 (e.g. computer processing unit (CPU) fans) to flow into this inlet 1302 and through the interconnected horizontal 1003 and vertical air channels 201a of the air channel interconnect network 1008 within the chip stack structure 2000 to thereby remove heat from the chip stack structure 2000 to the outside of the chip stack structure 2000 through the outlet 1305 thereby improving chip thermal conductivity. However, it is noted that in the present embodiment, air may also flow through outlet 1305 and through the interconnected horizontal 1003 and vertical air channels 201a of the air channel interconnect network 1008 within the chip stack structure 2000 to thereby remove heat out of the chip stack structure 2000 and through inlet 1302.

Moreover, the location of the inlets 1302 and outlets 1305 are not limited to the location set forth in the embodiment of FIG. 13. Rather, air may injected via the fans 1330 through any area of the chip stack or chips having the openings (e.g. inlets/outlets) such as, for example, the top surface and the edges of the chip stack structure or chips.

Next, FIGS. 15-24 illustrate a fabrication process to form two wafers bonded structure with an embedded air channel interconnect network in accordance with a third exemplary embodiment of the invention. It is noted that the third embodiment is similar to the first embodiment except that the air vias 201 which are used to create the vertical air channels 201a are first filled with dummy material (e.g. polyimide, polysilicon or dielectric) rather than copper as explained in further detail below. In particular, the third embodiment avoids the need to use wet etching which is required by the first embodiment to remove copper from inside the air vias 201 to form vertical air channels 201a. Rather, the present exemplary embodiment employs dummy material such as, for example, polyimide, polysilicon, or dielectric in air vias 201 prior to the formation of the vertical air channels 201a instead of copper and thus removal of the material in the air vias 201 can be accomplished using dry etching (e.g. oxygen plasma) rather than wet etching. The same reference numerals are used in the third embodiment to refer to the same elements depicted in the first embodiment and steps which are the same as those mentioned in the first embodiment will not be discussed again in detail in this embodiment.

Figure 15:
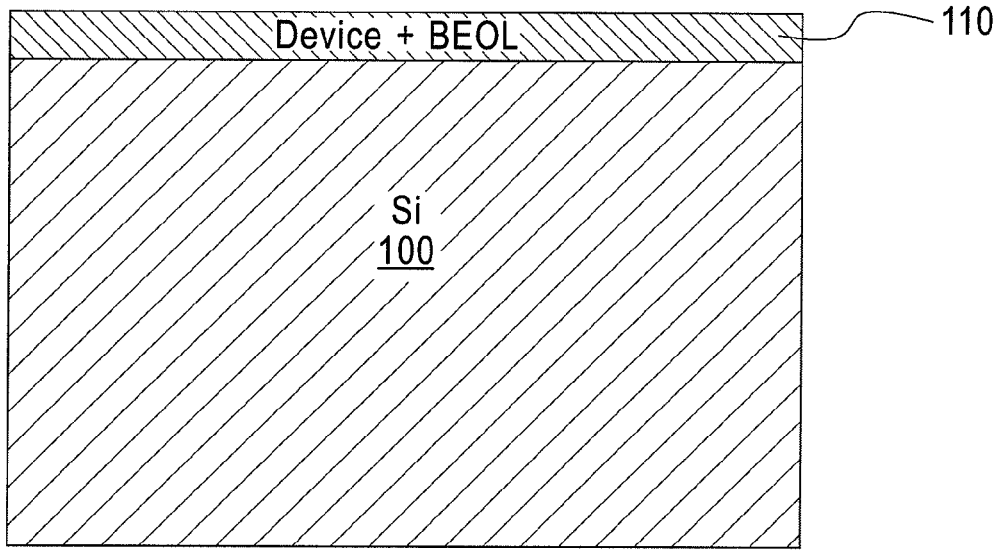
FIGS. 15-24 are schematic illustrations of steps in a fabrication process to form two wafers bonded structure having an air channel interconnect network in accordance with a third exemplary embodiment of the invention.

Referring to FIG. 15, an upper wafer 100, e.g., a silicon wafer, is processed through FEOL and BEOL process to have CMOS devices (e.g. transistors), resistors, capacitors and circuitry for connecting the CMOS devices provided in a device layer 110 formed of dielectric material which is located on the front surface of the wafer 100 in the same manner as the first embodiment depicted in FIG. 1.

Figure 16:
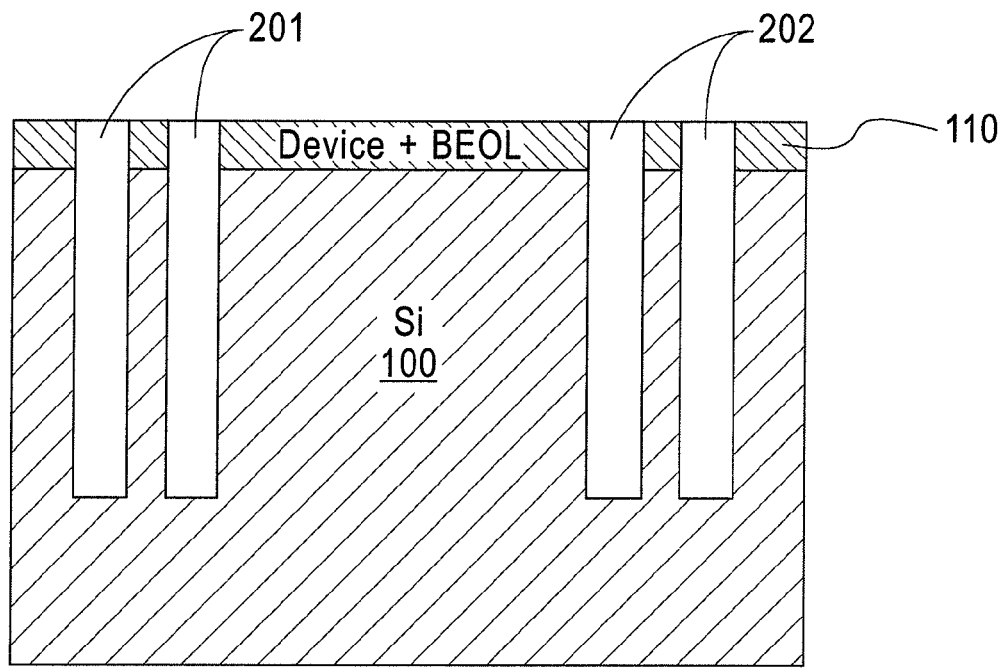

Referring to FIG. 16, conventional lithography processing is carried out to pattern TSVs followed by a conventional RIE process to form high aspect ratio contact holes in the same manner as set forth in the first embodiment depicted in FIG. 2. A portion of the holes is used for air vias 201 for thermal dissipation and other portion of the holes is used as through TSVs 202 for multiple chips interconnects.

Figure 17:
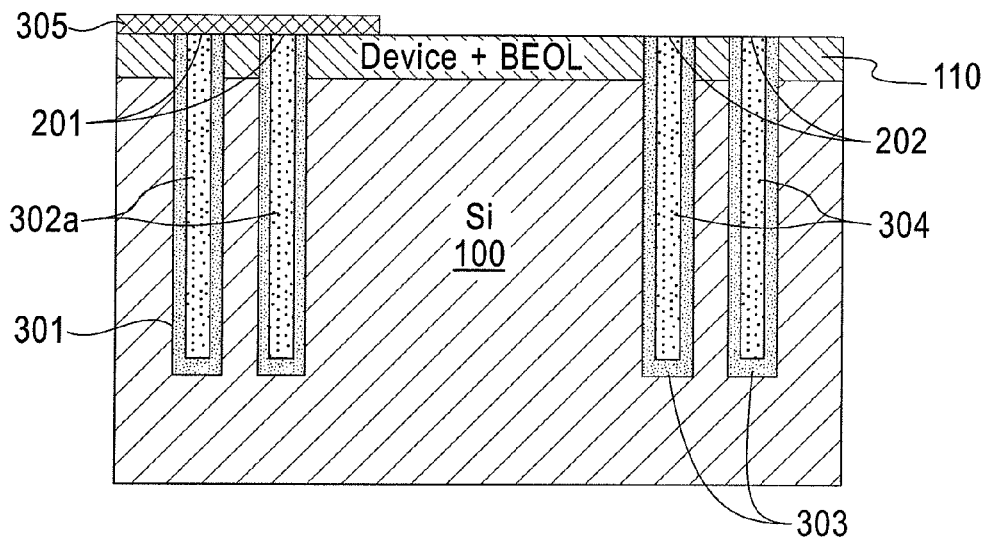

Referring to FIG. 17, sidewall liners 301, 303 are then formed on the sidewalls of the vias. These sidewall liners 301, 303 may be formed conformally on the sides of the air vias 201 and TSVs 202 using the same processes and materials as set forth in the first embodiment depicted in FIG. 3, Next, the air vias 201 are filled with a dummy material 302a such as, example, a polymer, polyimide, dielectric or polysilicon material. For example, in the present exemplary embodiment, the air vias 201 are filled in with polyimide. Next, the air via region is capped with blocking mask 305 to protect the air vias 201. The blocking mask 305 may be formed of a dielectric material such as, for example, a nitride. Next, copper is deposited on the silicon wafer to fill the TSVs 202 used for interconnects with copper 304 by copper plating. A CMP process is then performed to remove excess copper.

Figure 18:
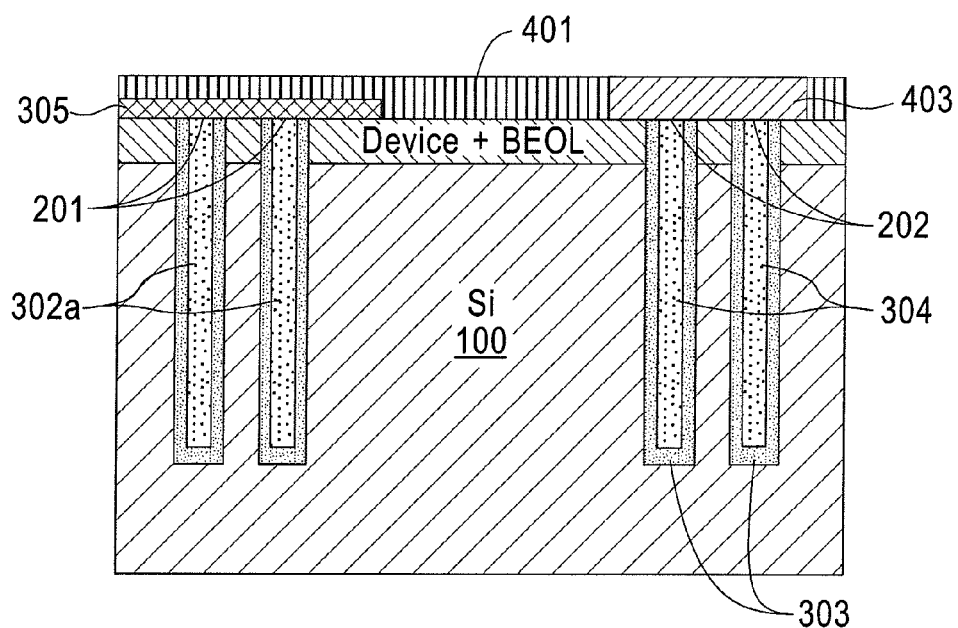

Referring to FIG. 18, passivation layer 401 is deposited on the silicon wafer 100, including on the blocking mask 305, the device layer 110 and TSVs 202. The passivation layer 401 may include dielectric materials or low-k dielectric materials as discussed in the first embodiment. Next, in the present exemplary embodiment, a conventional lithography process followed by a conventional RIE process are used to form openings in the passivation layer 401 for forming at least one copper (Cu) pad 403 in the opening of the passivation layer 401 on the TSVs 202 for grouping TSVs 202 as explained in further detail below.

For example, in the present exemplary embodiment, a conventional damascene process is carrier out wherein a photoresist is coated on the silicon wafer 100 and then the photoresist is patterned using conventional lithography techniques. Next, a conventional RIE process is performed using the openings in the photoresist to etch the passivation layer 401 in a region above and adjacent to the TSVs 202 to form openings in the passivation layer 401 which thereby expose the TSVs 202 and a portion of the device layer 110 adjacent to the TSVs 202. Then, the opening which exposes the TSVs 202 and a portion of the device layer 110 adjacent to the TSVs 202 is filled with copper by copper plating. A CMP is then performed to remove excessive copper material located above the passivation layer 401 to thereby form at least one Cu pad 403 on the TSVs 202 and the device layer 110 for grouping TSVs 202.

Figure 19:
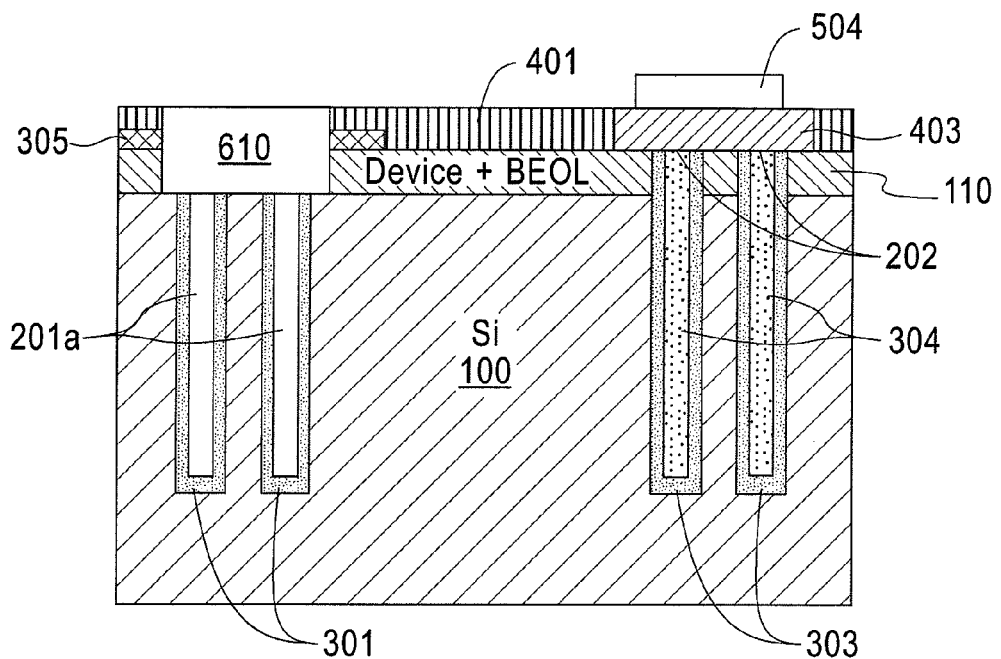

Referring to FIG. 19, an insulating layer is deposited on the silicon wafer 100, including on the passivation layer 401 and the copper pad 403. The insulating layer may be formed of a dielectric material. A portion of the insulating layer on the TSVs 202 is opened by conventional lithography and RIE processes as part of a conventional damascene process. Next, copper is deposited in the opening in the insulating layer formed on the TSVs 202 by copper plating. A CMP process is then performed to remove excess copper above the insulating layer, to thereby form Cu stud 504 filling in the opening formed in the insulating layer and on copper pad 403.

Subsequently, a photoresist is then applied by spin coating on the silicon wafer 100. The photoresist is patterned using conventional lithography techniques to form an opening in the photoresist in an area of the photoresist located above the region containing the air vias 201. A conventional dry etching process is then performed using the opening formed in the photoresist to remove the following in the region containing the air vias 201: (i) a portion of the insulating layer, (ii) a portion of the passivation layer 401, (iii) a portion of the blocking mask 305, (iv), a portion of the dielectric material of the device layer 110, as well as (v) removing substantially all of the dummy material 302a from inside the air vias 201. The removal of the dummy material 302a from the air vias 201 thereby results in the formation of the vertical air channels 201a. In addition, the removal of a portion of the insulating layer, a portion of the passivation layer 401, a portion of the blocking mask 305, a portion of the dielectric material of the device layer 110 discussed above results in the formation of opening 610 which exposes the vertical air channels 201a. The dummy material (e.g. polyimide) may be removed from the air vias 201 by, for example, oxygen plasma to form vertical air channels 201a. The photoresist is then removed.

Next, the methods performed in FIGS. 20-24 of the present exemplary embodiment may be carried out in essentially the same manner as the methods depicted in FIGS. 8-12 of the first embodiment as explained below.

Figure 20:
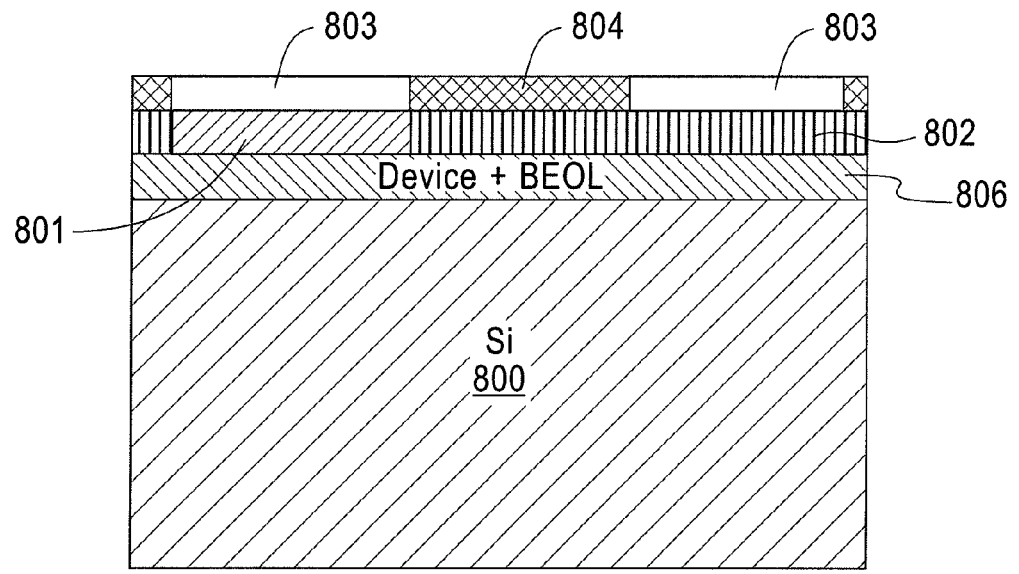

For example, referring to FIG. 20, the lower wafer 800, e.g., a silicon wafer, may be processed through FEOL and BEOL processes to have CMOS devices (e.g. transistors, resistors and capacitors) and circuitry for connecting the CMOS devices provided in a device layer 806 located on the front surface of the lower wafer 800 in the same manner as the lower wafer 800 depicted in FIG. 8 of the first embodiment.

In addition, in the embodiment depicted in FIG. 20, the processes for forming the first insulating layer 802, the copper pad 801 inside the first insulating layer 802, the forming of the second insulating layer 804 and the forming of the openings 803 in the second insulating layer 804 which expose the copper pad 801 and the first insulating layer 801 may be performed in the same manner as the processes set forth in the first embodiment of the present invention depicted in FIG. 8.

Figure 21:
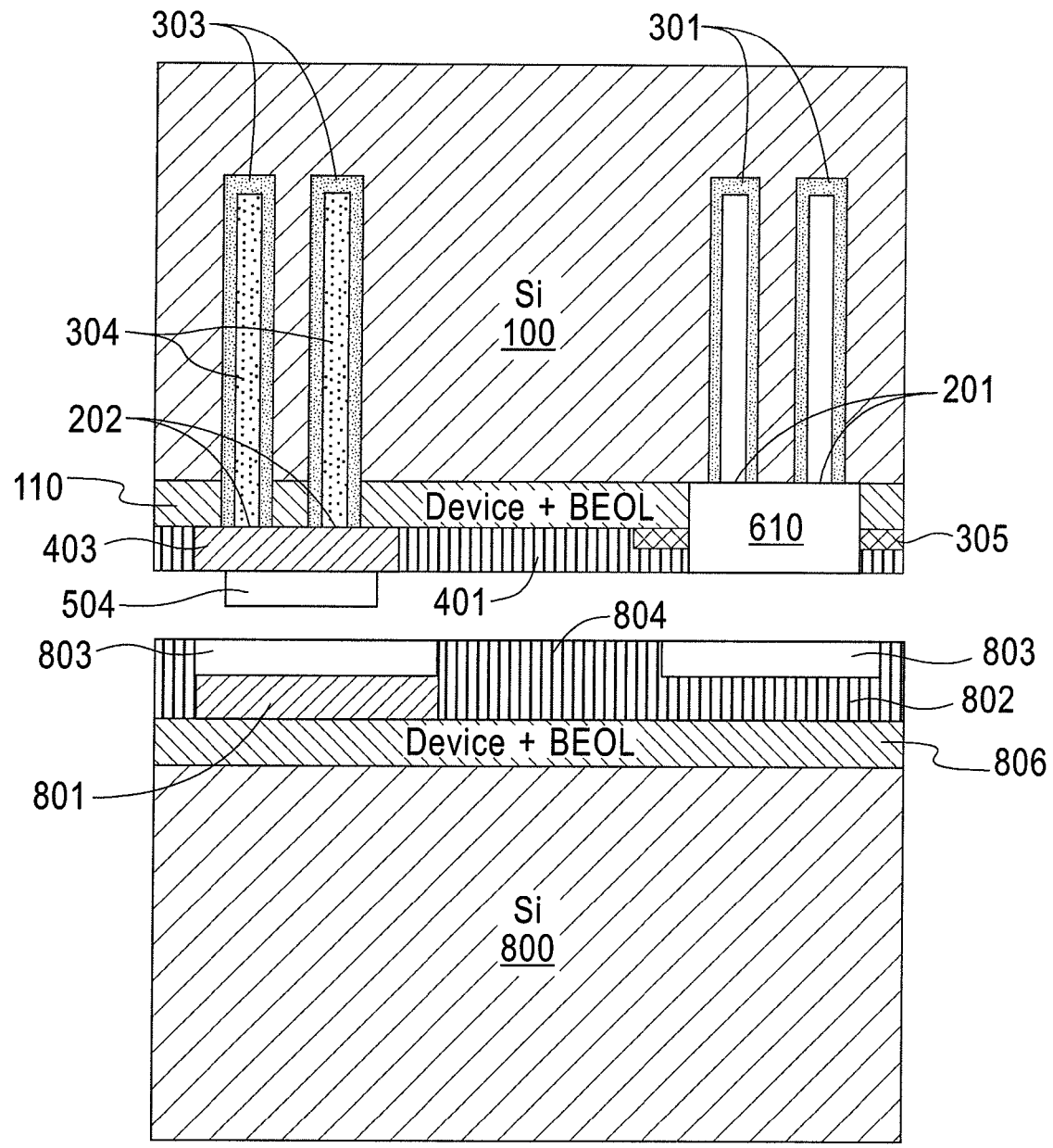
Figure 22:
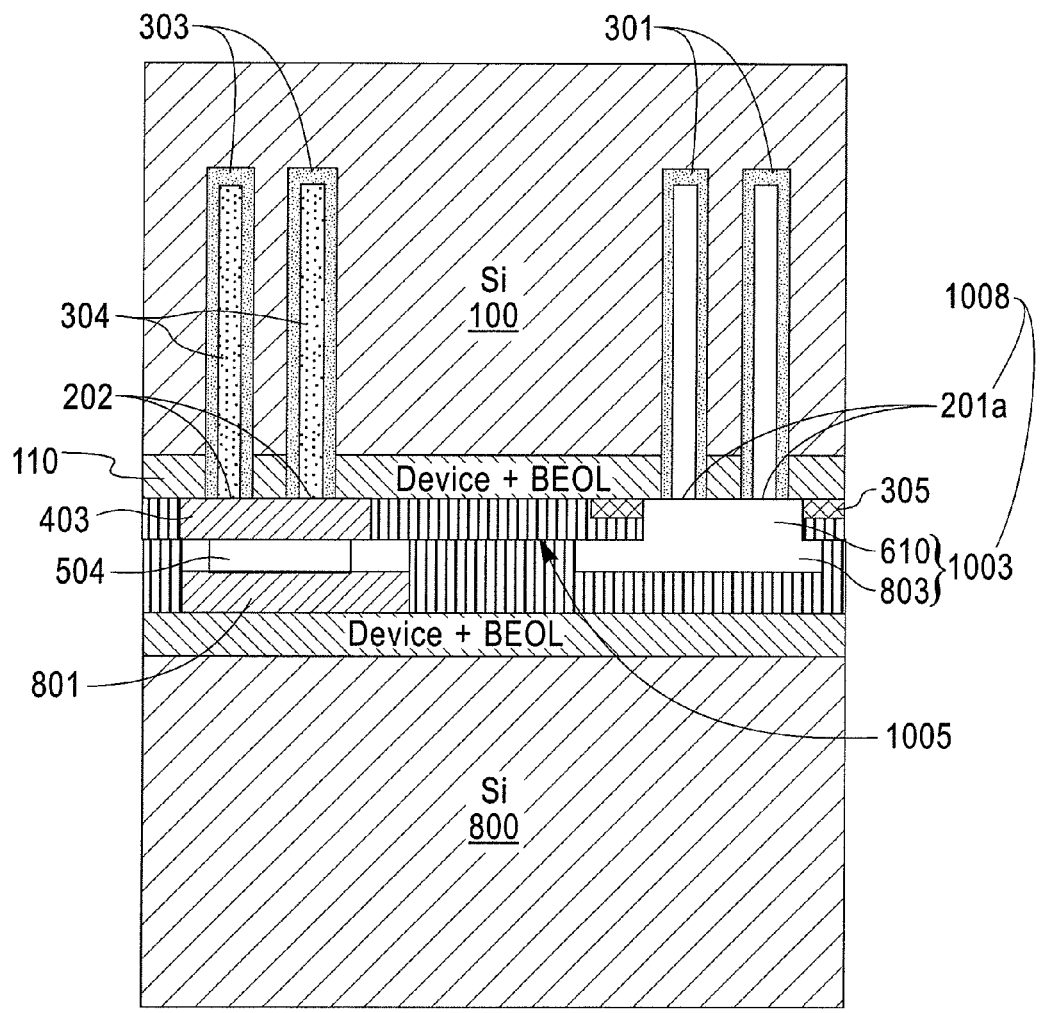

Now referring to FIGS. 21 and 22, respectively, the upper wafer 100 and the lower wafer 800 are then aligned with each other face to face and bonded to each other in the same manner as in the first embodiment depicted in FIGS. 9 and 10. Further, as with the first embodiment of the present invention depicted in FIG. 10, likewise in the present exemplary embodiment depicted in FIG. 22, horizontal air channel 1003 and the vertical air channels 201a are formed interconnected with each other within the upper wafer 100 and the lower wafer 800 and also in between the upper wafer and the lower wafer at bonding interface 1005 between the upper wafer 100 and the lower wafer 800 when the upper 100 and lower wafers 800 are bonded to each other. Also, the horizontal air channel 1003 is formed from opening 610 in the upper wafer combining with opening 803 in the lower wafer at the bonding interface 1005 between the bonded upper wafer 100 and lower wafer 800.

Figure 23:
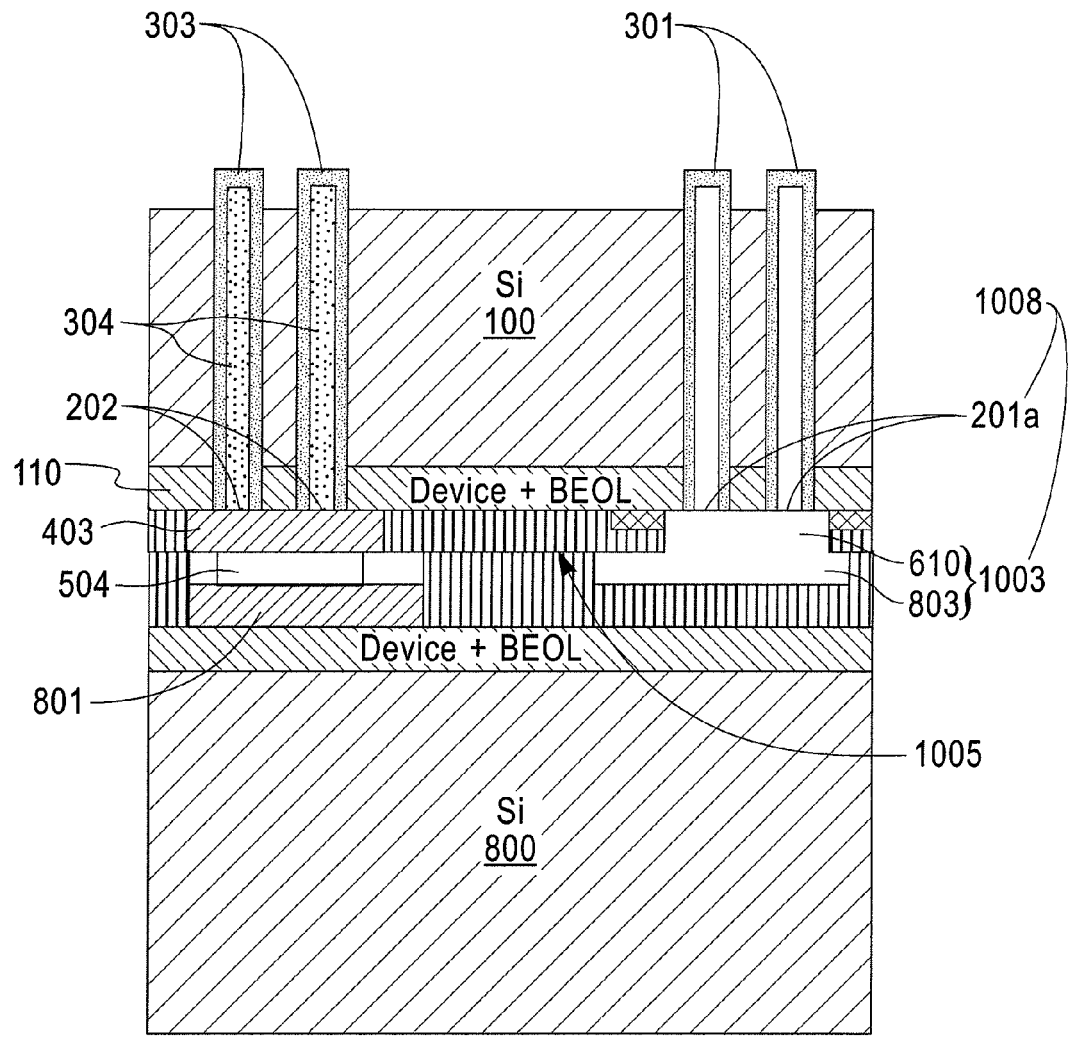

As shown in FIG. 23, after upper wafer 100 and the lower wafer 800 are bonded to each other, the backside 101 of the upper wafer 100 is thinned down to expose the TSVs 202 and vertical air channels 201a in a similar fashion as set forth in the first embodiment depicted in FIG. 11.

Figure 24:
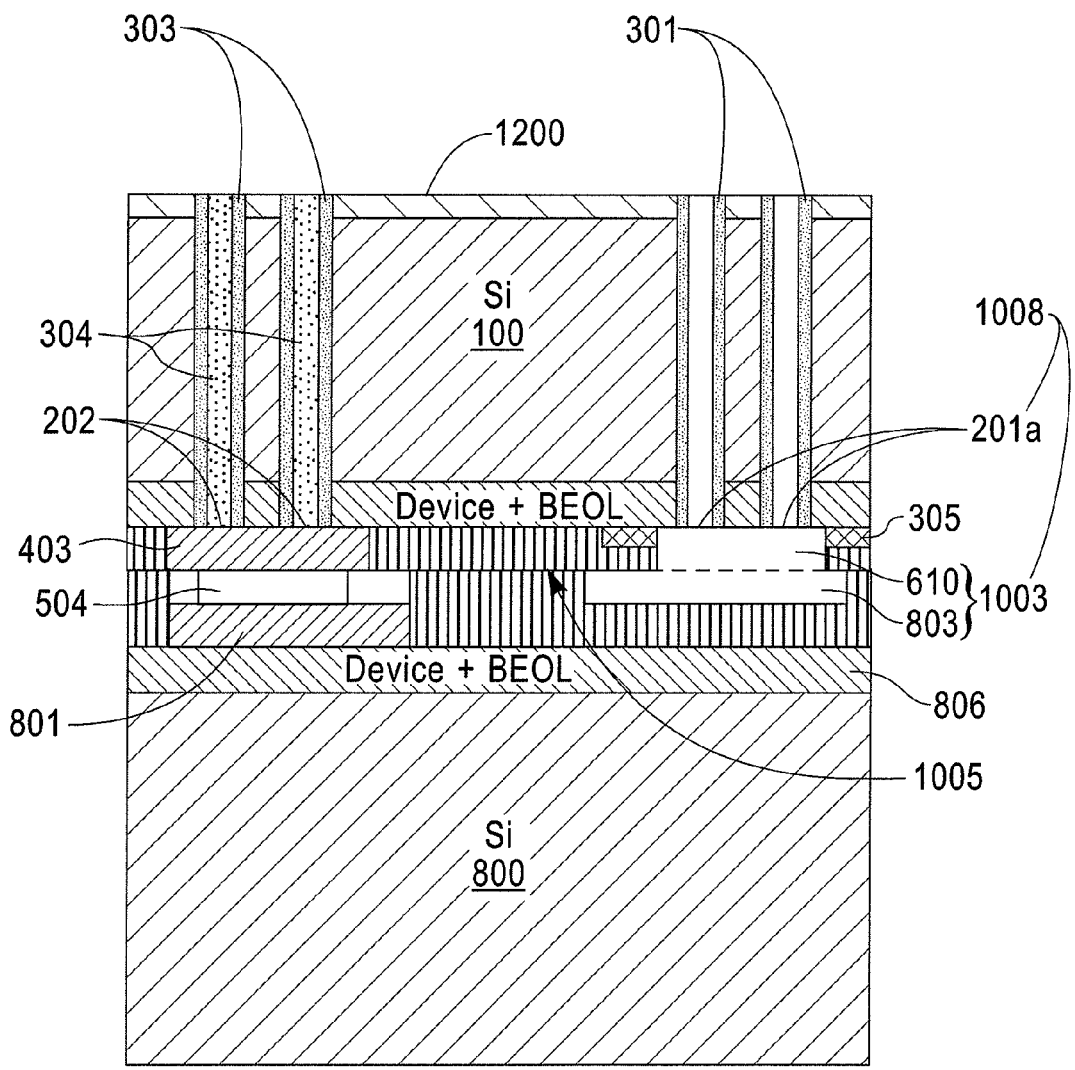

Referring to FIG. 24, an insulating layer 1200 is deposited on the backside 101 of the upper wafer 100 to act as a passivation layer and then a planarization step is performed using a CMP process to remove excess insulation layer 1200 material. Next, the wafers are diced into smaller chips using dicing techniques known in the art. The above-mentioned steps discussed above with regard to FIG. 24 may be performed in essentially the same manner as the first embodiment depicted in FIG. 12.

Figure 25:
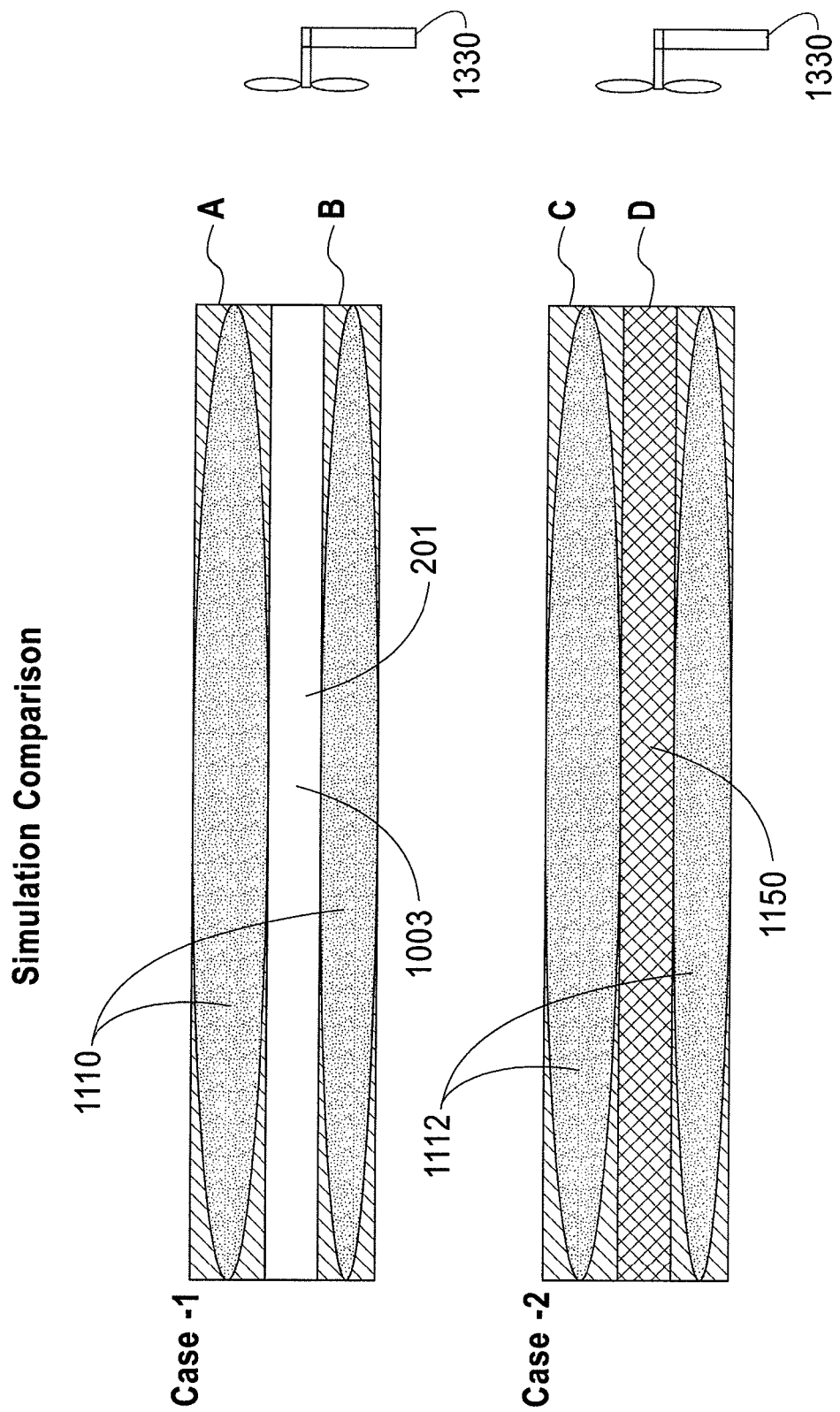
FIG. 25 illustrates a simulation for comparing the efficiency of heat removal from semiconductor chips using air channel interconnects of exemplary embodiments of the present invention in comparison to the conventional art cooling systems which utilize dummy metallization wiring.
Figure 26:
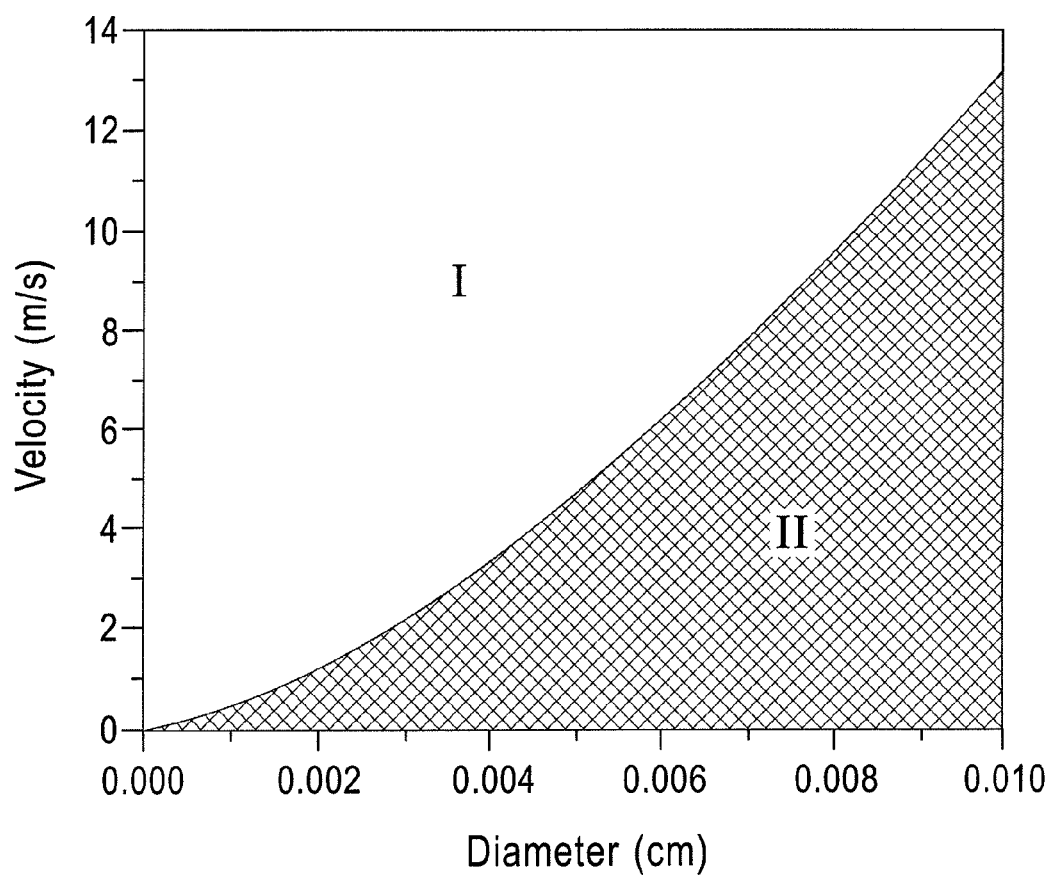
FIG. 26 is a graph which illustrates the efficiency of heat removal from a chip or chips as a function of the air velocity and channel diameter.

Next, FIGS. 25 and 26 illustrate simulations comparing the horizontal air channel 1003 and vertical air channels 201a which are interconnected with each other in accordance with, for example, the first exemplary embodiment (see FIGS. 10-12), the second exemplary embodiment (see FIG. 13) and the third exemplary embodiment (see FIGS. 22-24) discussed above in comparison to the conventional art which utilizes copper metallization wiring to cool semiconductor chips as explained below. In particular, the simulations illustrated in FIGS. 25 and 26 were determined using simulations that compared the steady-state distribution of heat through two types of model geometries to determine the efficacy of heat transfer of horizontal air channel 1003 and vertical air channels 201a of exemplary embodiments of the present invention in comparison to the conventional art cooling systems based only on dummy metallization wiring.

In the above-mentioned simulations shown in FIG. 25, case 1 represents interconnected horizontal air channels 1003 and vertical air channels 201a in accordance with, for example, the first exemplary embodiment, second exemplary embodiment or third exemplary embodiments of the present invention for cooling semiconductor chips, whereas case 2 represents a conventional art copper metallization wiring structure used to cool semiconductor chips. It is noted that in the conventional art other conductive materials, such as, for example, tungsten can be used in place of copper for cooling chips.

For ease of explanation, case 1 and case 2 are discussed with regard to the application to two chips. However, it is noted that these simulations set forth in comparing case 1 and case 2 are for illustrative purposes only and do not limit the scope of the present invention. For example, as noted above, exemplary embodiments of the present invention may be applied to designs having less then two chips or greater than two chips as is apparent from the description set forth herein. As shown in FIG. 25, in case 1, chip A and chip B are bonded together with the interconnected horizontal air channels 1003 and vertical air channels 201a formed embedded within and between these chips A, B. Moreover, in case 2, chip C and chip D are bonded together with the copper metallization 1150 formed therebetween.

It is noted that in the case 1 simulation, air is injected by fan 1330 to flow through interconnected horizontal air channels 1003 and vertical air channels 201a and remove heat from the chip generated from a heat source by convection. In contrast, in case 2 solid material, e.g. copper metallization 1150 is used to dissipate heat by conduction. The heat sources 1110 referred to case 1 and the heat sources 1112 referred to in case 2, for the purposes of this example, are each 100 W/cm² microprocessors, but are not limited thereto.

The mathematical formulas and calculations used to determine the heat removal efficiency/heat flux of case 1 (interconnected vertical air channels 201a and horizontal air channel 1003 which remove heat from chips through convection) and case 2 (copper metallization to dissipate heat by conduction) in comparison to one another are discussed below.

In the case of forced convection through a tube, the heat flux, Q, is a function of the difference in temperature ($\Delta T$) between both ends of the tube, the velocity of the medium, u, the diameter of the tube, d, and several properties associated with the medium. Most of these properties can be collected into dimensionless parameters, such as the Reynold's number, Re, and the Prandtl number, Pr, which are commonly used in fluid mechanics. The one remaining property, the thermal conductivity of the medium, K, is used to represent the heat flux through the channel in the following equation:

$$Q = 0.023 K\, Re^{0.8} Pr^{0.3} \Delta T/d \tag{1}$$

For air in the range of temperatures considered for this application, K=0.0262 W/m °C., Pr=0.708 and Re=6.36 10⁴ u d.

For dummy metallization (e.g. copper) wiring, the dominant mode of heat flux is conduction. If we consider the case of a constant heat flux generated along a wire with an identical diameter d but a length l, then the solution to the steady-state conduction equation possesses the following form:

$$Q = K\, d\Delta T/(2\, l^2) \tag{2}$$

where it is assumed that the heat flux moves from the center of the chip outwards towards the edge of the chip. For Cu, K=380 W/m °C. and we consider l to be half of the chip size, approximately 1 cm.

For a given $\Delta T$ between the chip interior and the ambient air temperature, we can calculate the heat flux for both methods of cooling.

Next, using the above mentioned mathematical formulas, a contour plot depicted in FIG. 26 was plotted which illustrates which method is more efficient as a function of the air velocity and as a function of the channel diameter for removing heat from a chip or chips. Region I of the graph depicted in FIG. 26 illustrates the situation where there is more efficient heat flow through the interconnected horizontal air channel 1003 and vertical air channels 201a of case 1 than through the copper metallization 1150 of case 2. In contrast, region II of FIG. 26 illustrates the situation where there is more efficient heat flow through the copper metallization 1150 of case 2.

In particular, as shown in FIG. 26, for a given channel diameter, increasing the air velocity makes the interconnected horizontal 1003 and vertical air channels 201a of case 1 more effective at removing the heat flux than the copper metallization of case 2 of the conventional art. (See Region I of FIG. 26). In contrast, increasing the channel diameter beyond a threshold value (e.g.: 0.006 cm or 60 μm for a velocity of 6 m/s) may lead to more heat removal using dummy metallization of case 2 than using the horizontal air channels 1003 (See region II of FIG. 26). However, in the regime of small channels (less than 10 μm) the air channel scheme of case 1 is more efficient for a wider range of air velocities than the copper metallization scheme of the conventional art of case 2. Thus, as illustrated by the simulations of FIGS. 25 and 26, the horizontal air channels 1003 and vertical air channels 201a which are interconnected with each other in accordance with exemplary embodiments of the present invention are more efficient at removing heat from semiconductor chips than the conventional art which uses copper metallization to cool chips, when the diameter for each of the vertical air channels 201a and the horizontal air channels 1003, e.g. less than 10 μm.

In sum, exemplary embodiments of the present invention provide at least the following benefits set forth below:

Exemplary embodiments of the present invention allow for air to flow freely into and outside of, for example, a chip or 3D-IC chip stack structure having the interconnected vertical and horizontal channels through one or more openings (e.g. inlets and outlets) in a peripheral region of the chip or chip stack structure for removing heat to the outside of these structures, thereby efficiently cooling these chip or chip stack structures.

Exemplary embodiments of the present invention allow for heat to be removed from chips more efficiently by convection when using the interconnected vertical and horizontal channel each having small diameter sizes of less than 10 µm than conventional methods and structures which use conduction by metallization, e.g. copper metallization, to cool chips. Moreover, exemplary embodiments of the present invention in addition to providing improved heat removal efficiency using the interconnected vertical and horizontal air channels having the small channel diameters, also allow for even further improvement in the efficiency of heat removal when the circulation velocity of the air blow into the interconnected horizontal and vertical air channels of the chips or chip stack structure through the air inlets is increased.

In addition, exemplary embodiments of the present invention allow for interconnected vertical and horizontal air channels to eliminate hot spot and address local heating issues by having the these air interconnected channels within the stacked chips as well as at an interface between two adjacently bonded chips such that these interconnected air channels surround these hot spots or congested signal traffic areas.

Also, by being more efficient at heat removal at smaller channel diameters (e.g. less than 10 µm), the interconnected air channels of exemplary embodiments of the present invention allow for smaller chip design than the conventional art which uses metallization (e.g. copper metallization) to cool chips.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming interconnected air channels within semiconductor wafers comprising the steps of:
   processing an upper wafer to form one or more semiconductor devices and circuitry for connecting the one or more semiconductor devices in a device layer located on a front surface of the upper wafer;
   forming a plurality of air vias in a portion of the upper wafer and a plurality of through-silicon vias (TSVs) in another portion of the upper wafer;
   filling each of the plurality of air vias with a material comprising one of a conductive material or a dummy material and filling each of the plurality of TSVs with a conductive material;
   forming a protective structure on the air vias and a bonding pad on the TSVs;
   forming a stud for wafer bonding on the bonding pad located on the TSVs;
   removing at least a portion of the protective structure and the conductive material from inside the air vias, thereby forming a plurality of vertical air channels and an opening exposing the plurality of vertical air channels;
   processing a lower wafer to form one or more semiconductor devices and circuitry for connecting the one or more semiconductor devices in a device layer located on a front surface of the lower wafer;
   forming a bonding pad on the device layer located on a front surface of the lower wafer;
   depositing an insulating layer on the lower wafer, including on the bonding pad;
   forming an opening in the insulating layer exposing the bonding pad;
   aligning and bonding the upper wafer and the lower wafer to each other, thereby forming an embedded air channel interconnect network which includes the vertical air channels and a horizontal air channel which are interconnected to each other within at a bonding interface between the bonded upper wafer and lower wafer;
   thinning a backside of the upper wafer to expose the vertical air channels and the TSVs; and
   forming a passivation layer on the exposed surface of the backside of the upper wafer.

2. The method according to 1, wherein the filling of the plurality of air vias and the plurality of TSVs comprises filling each of the air vias and the TSVs with copper by a copper plating process.

3. The method according to claim 2, wherein prior to the filling of the plurality of air vias and the plurality of TSVs with copper, a sidewall liner is deposited on the air vias and the TSVs.

4. The method of claim 1, wherein the forming of the plurality of air vias and the plurality of TSVs comprises:
   forming a photoresist on the device layer located on the front surface of the upper wafer; and
   performing a lithography process and reactive etching (RIE) process to etch both the device layer and the upper wafer, thereby forming the air vias and the TSVs in the device layer and the upper wafer.

5. The method of claim 1, wherein the etching of the device layer is performed using an etchant containing fluorocarbons and the etching of the upper wafer is performed using an etchant containing halogens.

6. The method of claim 1, wherein the protective structure on the plurality of air vias is a dummy copper pad, the bonding pad on the plurality of TSVs is a copper bonding pad and the plurality of air vias and the plurality of TSVs are each filled inside with copper, and wherein the forming of the dummy copper pad and the copper bonding pad comprises:
   depositing a first insulating layer formed of a low-k dielectric material on the device layer located on the front surface of the upper wafer;
   etching a portion of the first insulating layer and a portion of the device layer to form an opening exposing the plurality of air vias and etching another portion of the first insulating layer and another portion of the device layer to form an opening exposing the plurality of TSVs;
   filling in the opening exposing the plurality of air vias and the opening exposing the plurality of TSVs with copper by copper plating; and
   performing a chemical mechanical polish (CMP) process to remove excess copper material above the first insulating layer to thereby form the dummy copper pad on the plurality of air vias and the copper bonding pad on the plurality of TSVs, respectively.

7. The method of claim 6, wherein the dummy copper pad and the copper inside the plurality of air vias are all substantially removed by a wet etching process.

8. The method of claim 1, wherein the protective structure on the plurality of air vias is a blocking mask formed of a layer of nitride and the bonding pad on the plurality of TSVs is a copper bonding pad, and wherein prior to the forming of the blocking mask on the plurality of air vias, the following steps are performed comprising:

forming side wall liners conformally on the plurality of air vias and the plurality of TSVs;

filling the plurality of air vias with a dummy material comprising polyimide; and filling the plurality of TSVs with copper by copper plating.

9. The method of claim 8, wherein the forming of the copper bonding pad on the plurality of TSVs comprises:

depositing a passivation layer formed of a low-k dielectric material on the device layer located on the front surface of the upper wafer;

performing a lithography and reactive ion etching (RIE) process to form an opening in portion of the passivation layer thereby exposing the plurality of TSVs;

filling the opening in the passivation layer with copper by copper plating; and performing a chemical mechanical processing (CMP) to remove excess copper material above the passivation layer, thereby forming the copper bonding pad on the plurality of TSVs.

10. The method of claim 9, wherein the stud for wafer bonding on the copper bonding pad located on the plurality of TSVs of the upper wafer is a copper stud formed by the steps comprising:

depositing an insulating layer on the upper wafer, including on the passivation layer and the copper pad;

performing a lithography and reactive ion etching (RIE) process to form an opening in a portion of the insulating layer exposing the copper bonding pad formed on the TSVs;

depositing copper in the opening in the insulating layer exposing the copper bonding pad by copper plating; and performing a CMP process to remove excess copper above the insulating layer, to thereby form copper stud on the copper bonding pad.

11. The method of claim 8, wherein at least a portion of the blocking mask is removed by the steps comprising:

depositing a photoresist on the upper wafer;

etching a portion of the photoresist, the insulating layer, the passivation layer, the blocking mask and the device layer in the region containing the air vias using lithography and RIE processes to form an opening thereby exposing the plurality of air vias; and removing the polyimide dummy material from the plurality of air vias using oxygen plasma.

12. The method of claim 1, wherein the plurality of vertical air channels and the horizontal air channel interconnected to each other each have a diameter in the range of 0.1 µm to 10 µm.

13. The method of claim 1, wherein the opening exposing the plurality of vertical air channels of the upper wafer and the opening exposing the bonding pad formed in the first insulating layer of the lower wafer together collectively form the horizontal air channel at the bonding interface between the upper wafer and the lower wafer bonded to each other.

14. The method of claim 1, wherein the upper wafer and the lower wafer are aligned to each other face to face using one of infrared (IR) alignment technique or a laser alignment technique.

15. The method of claim 1, wherein the upper wafer and the lower wafer are bonded to each other using a copper-copper thermal compression process.

16. The method of claim 1, wherein the backside of the wafer is thinned down using at least one of a grinding process, a high-density chemical mechanical polishing and a high-density plasma etching CMP process.

17. The method of claim 7, wherein when removing the dummy copper pad and the copper inside the plurality of air vias, a small amount of copper material from the dummy copper pad is left on an edge of the upper wafer such that when the upper wafer and the lower wafer are bonded to each other, a side plug to prevent clogging of the vertical air channels is formed between the upper and lower wafer.

* * * * *